US012690435B2

(12) United States Patent
Li et al.

(10) Patent No.: US 12,690,435 B2
(45) Date of Patent: Jul. 21, 2026

(54) SELF-ALIGNED CONTACT BASED VIA TO BACKSIDE POWER RAIL

(71) Applicant: INTERNATIONAL BUSINESS MACHINES CORPORATION, Armonk, NY (US)

(72) Inventors: Tao Li, Slingerlands, NY (US); Richard C. Johnson, Selkirk, NY (US); Kisik Choi, Watervliet, NY (US); Ruilong Xie, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 380 days.

(21) Appl. No.: 18/173,359

(22) Filed: Feb. 23, 2023

(65) Prior Publication Data

US 2024/0290657 A1    Aug. 29, 2024

(51) Int. Cl.
| | |
|---|---|
| *H10D 84/83* | (2025.01) |
| *H10D 62/10* | (2025.01) |
| *H10D 64/01* | (2025.01) |
| *H10W 20/00* | (2026.01) |
| *H10W 20/41* | (2026.01) |

(52) U.S. Cl.
CPC ........ *H10W 20/069* (2026.01); *H10D 62/121* (2025.01); *H10D 64/017* (2025.01); *H10W 20/076* (2026.01); *H10W 20/435* (2026.01)

(58) Field of Classification Search
None
See application file for complete search history.

(56) References Cited

U.S. PATENT DOCUMENTS

| | | | |
|---|---|---|---|
| 9,570,395 | B1 | 2/2017 | Sengupta |
| 9,805,983 | B1 | 10/2017 | Cheng et al. |
| 10,586,765 | B2 | 3/2020 | Smith |
| 10,636,739 | B2 | 4/2020 | Beyne |

(Continued)

OTHER PUBLICATIONS

Schor, "Intel Announces 20Å Node: RibbonFET Devices, PowerVia, 2024 Ramp," WikiChip Fuse, Chips and Semi News, Jul. 26, 2021, 7 Pages. <https://fuse.wikichip.org/news/5943/intel-announces-20a-node-ribbonfet-devices-powervia-2024-ramp/>.

(Continued)

*Primary Examiner* — Steven B Gauthier
*Assistant Examiner* — Lamont B Koo
(74) *Attorney, Agent, or Firm* — Robert R. Aragona

(57) ABSTRACT

According to the embodiment of the present invention, a semiconductor device includes a first nanodevice and a second nanodevice. The second nanodevice is adjacent to and parallel to the first nanodevice along an x-axis. A dielectric fill is located between the first nanodevice and the second nanodevice. A dielectric liner is comprised of a first dielectric liner and a second dielectric liner. The first dielectric liner is located between the first nanodevice and the dielectric fill. The second dielectric liner is located between the second nanodevice and the dielectric fill. A plurality of self-aligned contact (SAC) caps is comprised of a head section and a shaft section. The head section extends a first width parallel to the x-axis and is in direct contact with a frontside of the dielectric liner. The shaft section extends a second width parallel to the x-axis. The first width is greater than the second width.

19 Claims, 32 Drawing Sheets

Top Down View

(56) References Cited

U.S. PATENT DOCUMENTS

| | | | |
|---|---|---|---|
| 10,700,207 | B2 | 6/2020 | Chen |
| 10,797,139 | B2 | 10/2020 | Morrow |
| 11,257,764 | B2 | 2/2022 | Hiblot et al. |
| 11,355,601 | B2 | 6/2022 | Chiang |
| 11,362,213 | B2 | 6/2022 | Ju |
| 2020/0105671 | A1 | 4/2020 | Lai |
| 2021/0305252 | A1 | 9/2021 | Chiang |
| 2021/0305381 | A1 | 9/2021 | Chiang |
| 2021/0376093 | A1 | 12/2021 | Chu |
| 2022/0238388 | A1 | 7/2022 | Hiblot et al. |
| 2022/0302268 | A1 | 9/2022 | Chiang |
| 2022/0399334 | A1 | 12/2022 | Guler et al. |
| 2023/0046117 | A1 | 2/2023 | Tao et al. |
| 2023/0067354 | A1 | 3/2023 | Wei |
| 2023/0132353 | A1 | 4/2023 | Xie et al. |
| 2023/0139929 | A1 | 5/2023 | Xie et al. |
| 2023/0335444 | A1* | 10/2023 | Wang .................... H01L 23/485 |
| 2024/0120274 | A1 | 4/2024 | Lee et al. |
| 2025/0048715 | A1 | 2/2025 | Zou et al. |

OTHER PUBLICATIONS

United States Notice of Allowance dated Jan. 28, 2026, 8 pages in
U.S. Appl. No. 18/362,057.

* cited by examiner

Top Down View

Cross Section X

Cross Section Y₂

Cross Section Y₁

Cross Section X

Cross Section Y₂

Cross Section Y₁

Top Down View

Cross Section X

Cross Section Y₂

Cross Section Y₁

Cross Section X

Cross Section Y₂

Cross Section Y₁

Cross Section X

Cross Section Y₂

Cross Section Y₁

Top Down View

Cross Section X

Cross Section Y₂

Cross Section Y₁

Cross Section X

Cross Section Y₂

Cross Section Y₁

Cross Section X

Cross Section Y₂

Cross Section Y₁

Cross Section X

Cross Section Y₂

Cross Section Y₁

Top Down View

Cross Section X

Cross Section Y₂

Cross Section Y₁

Cross Section X

Cross Section Y₂

Cross Section Y₁

Cross Section X

Cross Section Y$_2$

Cross Section Y$_1$

Cross Section X

Cross Section Y₂

Cross Section Y₁

Cross Section X

Cross Section Y₂

Cross Section Y₁

SELF-ALIGNED CONTACT BASED VIA TO BACKSIDE POWER RAIL

BACKGROUND

The present invention relates generally to the field of microelectronics, and more particularly to a semiconductor device structure, and a method for forming a semiconductor device.

A nanosheet (NS) is the lead device architecture in continuing CMOS scaling. However, nanosheet technology has shown issues when scaling down such that as the devices become smaller and closer together, they are interfering with each other. Furthermore, as the devices become smaller and closer together, forming the connections to a backside power network is becoming more difficult.

SUMMARY

According to the embodiment of the present invention, a semiconductor device includes a first nanodevice comprised of a plurality of first transistors and a second nanodevice comprised of a plurality of second transistors. The second nanodevice is located adjacent to and parallel to the first nanodevice along an x-axis. A dielectric fill is located between the first nanodevice and the second nanodevice. A dielectric liner is comprised of a first dielectric liner and a second dielectric liner. The first dielectric liner is located between the first nanodevice and the dielectric fill. The second dielectric liner is located between the second nanodevice and the dielectric fill. A plurality of self-aligned contact (SAC) caps is comprised of a head section and a shaft section. The head section of each SAC cap extends a first width parallel to the x-axis and is in direct contact with a frontside of the dielectric liner. The shaft section extends a second width parallel to the x-axis. The first width is greater than the second width.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Figure 1:
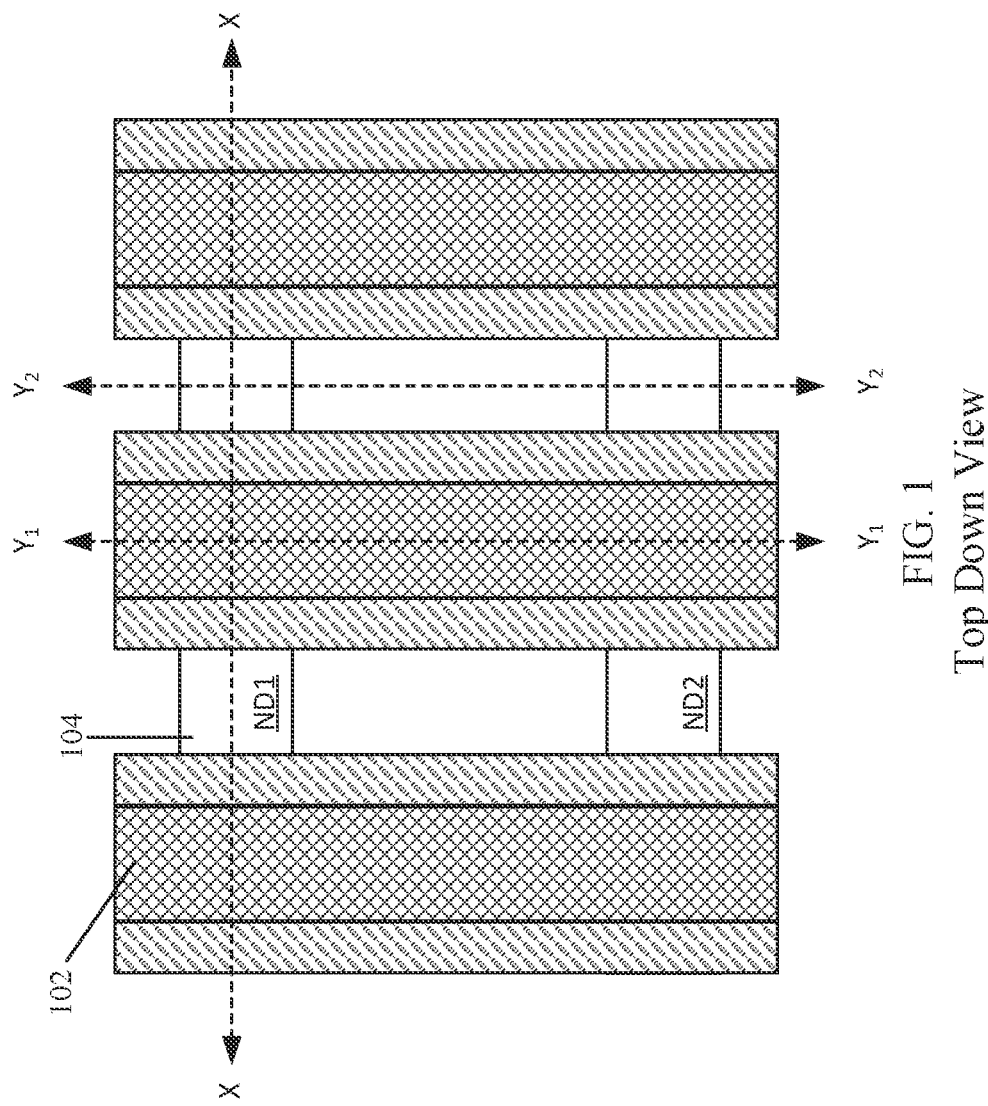
FIG. 1 illustrates a top-down view of a plurality of nanodevices, in accordance with the embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

References in the specification to "one embodiment," "an embodiment," "an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art to affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "formed on," or "formed atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be a direct or indirect positional relationship. As an example of an indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both an indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes which are used to form a micro-chip that will be packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout.

When a via to the backside power rail (VBPR) extends downwards from a frontside contact the via may be located between two active regions on a nanodevice. The downwards extending VBPR is connected to a component, for example, a backside power rail. The size of the VBPR is limited by a contact component/gate piece, and the current VBPR scheme is not compatible with a self-aligned contact (SAC). For example, there is a high risk of frontside contact-to-gate shorts.

By forming a SAC cap over the gate and a recessed dielectric liner, the risk of a frontside contact-to-gate short may be greatly reduced. The present invention does not require that all advantages need to be incorporated into every embodiment of the invention.

The present invention is directed to forming a VBPR in a space between a plurality of nanodevices (e.g., PFET and/or NFET transistors) such that the VBPR connects a source/drain contact to a backside power rail (BPR). The VBPR is formed through a multistage processing, where the first stage forms a first trench by etching a portion of the gates, an interlayer dielectric (ILD), and a shallow trench isolation (STI) region. The second stage forms a dielectric liner and a dielectric fill inside the first trench. The third stage forms a second trench and a third trench by etching a portion of the dielectric liner and the gate. The fourth stage fills the second trench and the third trench with a dielectric material to form the SAC cap above the gate and the dielectric liner. The fifth stage forms a fourth trench by etching a portion of the dielectric fill. The sixth stage fills the fourth trench with a conductive metal, forming the VBPR.

FIG. 1 illustrates a top-down view of a plurality of nanodevices ND1, ND2, in accordance with the embodiment of the present invention. The adjacent and parallel devices along the x-axis include a first nanodevice ND1 comprised of a plurality of first transistors, and a second nanodevice ND2 comprised of a plurality of second transistors. Cross-section X is a cross section perpendicular to the gates along the horizontal axis of the first nanodevice ND1. Cross-section $Y_1$ is a cross section parallel to the gates in the gate region 102 across the plurality of nanodevices ND1, ND2. Cross-section $Y_2$ is a cross section parallel to the gates in the source/drain region 104 across the plurality of nanodevices ND1, ND2. It may be appreciated that the embodiment of the present invention is not limited to nanodevices ND1, ND2 and that other devices including, but not limited to, FinFET, nanowire, and a planar device may also be used.

Figure 2:
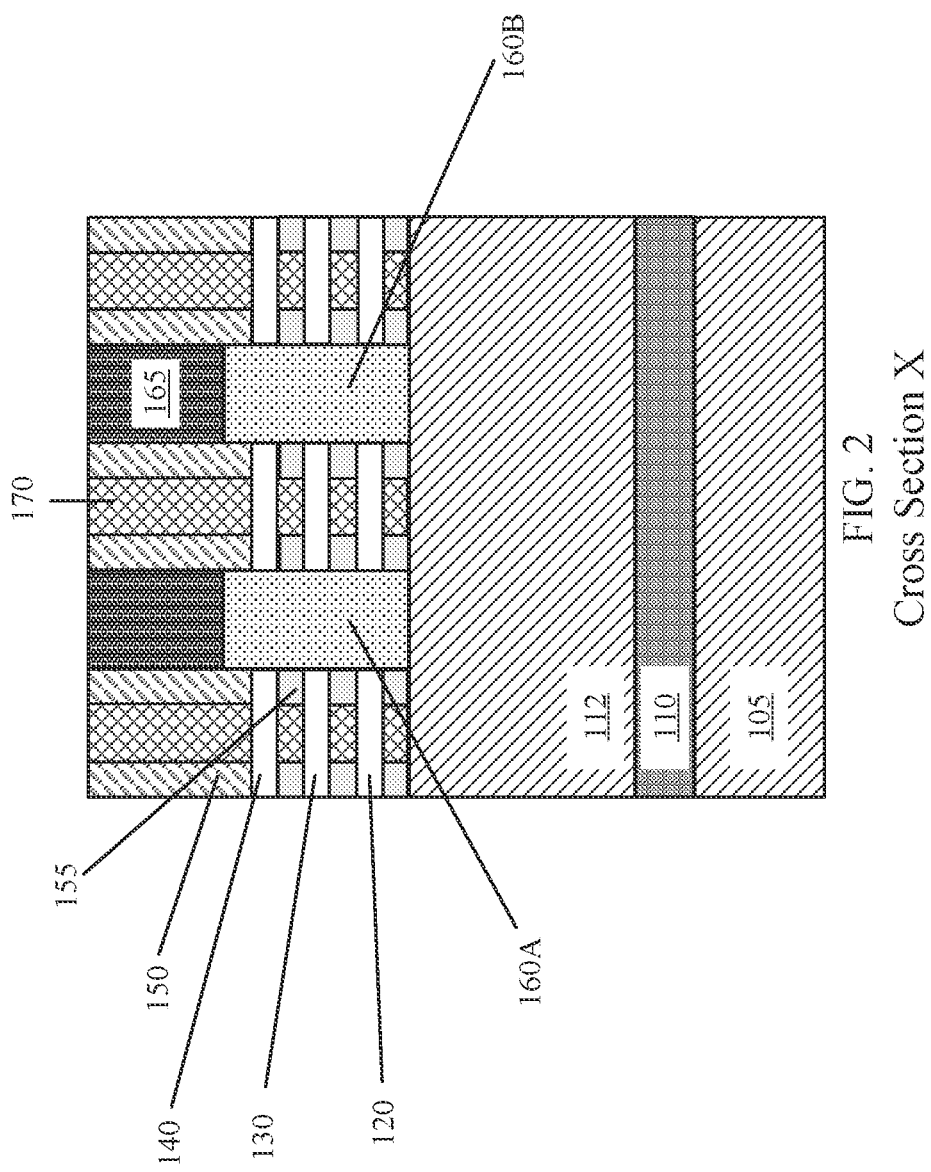
FIGS. 2-4 illustrate cross sections X, $Y_1$, and $Y_2$, respectively, of the plurality of nanodevices after interlayer dielectric (ILD) deposition, nanosheet formation, shallow trench isolation (STI) region formation, gate formation, gate spacer and inner spacer formation, source/drain formation, and etch stop layer formation, in accordance with the embodiment of the present invention.
Figure 4:
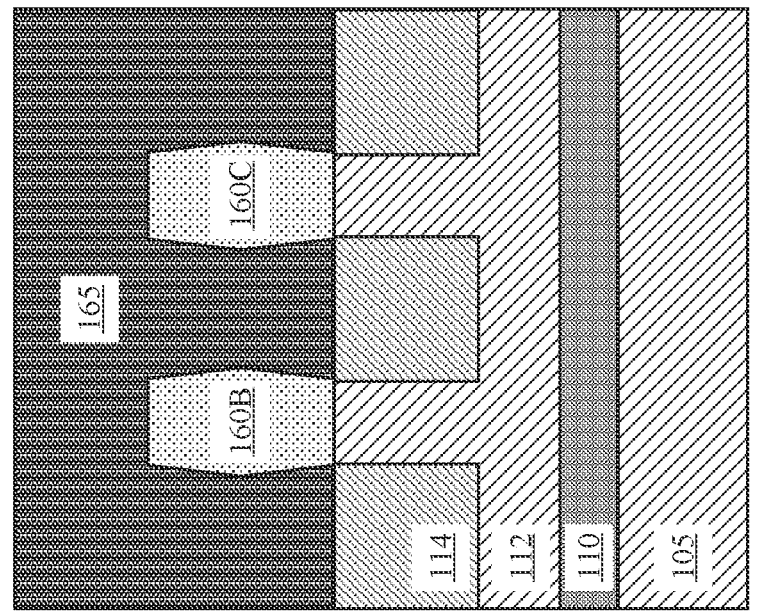
Figure 3:
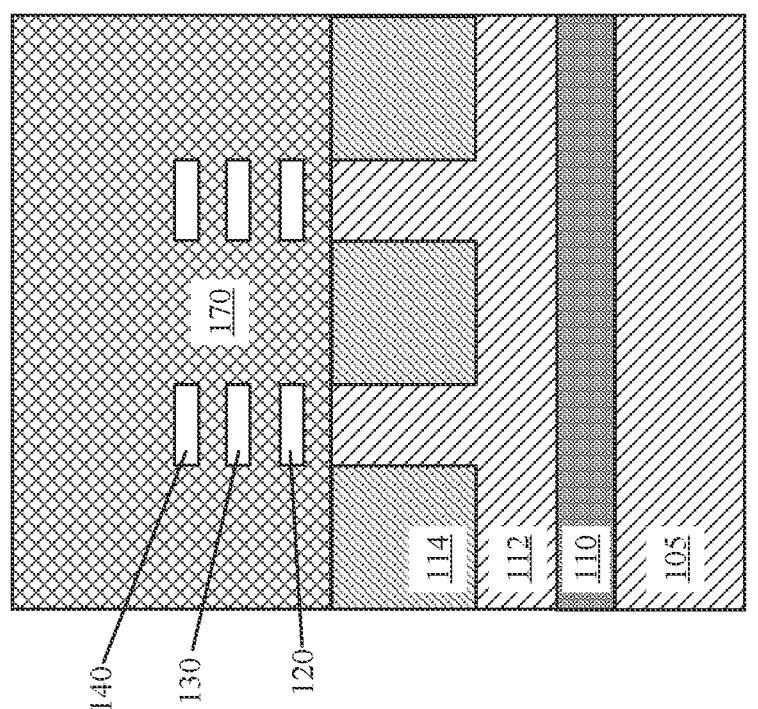

FIGS. 2-4 illustrate cross sections X, $Y_1$, and $Y_2$, respectively, of the plurality of nanodevices ND1, ND2 after interlayer dielectric (ILD) 165 deposition, nanosheet 120, 130, 140 formation, STI region 114 formation, gate formation 170, gate spacer 150 and inner spacer 155 formation, source/drain 160A, 160B, 160C formation, etch stop layer 110 formation, and CMP in accordance with the embodiment of the present invention. The plurality of nanodevices ND1, ND2 include a substrate 105, an etch stop layer 110, an underlying substrate layer 112, an STI region 114, a first nanosheet 120, a second nanosheet 130, and a third nanosheet 140. The substrate 105 and the etch stop layer 110 can be, for example, a material including, but not necessarily limited to, silicon (Si), silicon germanium (SiGe), Si:C (carbon doped silicon), carbon doped silicon germanium (SiGe:C), III-V, II-V compound semiconductor or another like semiconductor. In addition, multiple layers of the semiconductor materials can be used as the semiconductor material of the substrate 105. In some embodiments, the substrate 105 includes both semiconductor materials and dielectric materials. The semiconductor substrate 105 may also comprise an organic semiconductor or a layered semiconductor such as, for example, Si/SiGe, a silicon-on-insulator or a SiGe-on-insulator. A portion or the entire semiconductor substrate 105 may also be comprised of an amorphous, polycrystalline, or monocrystalline. The semiconductor substrate 105 and the etch stop layer 110 may be doped, undoped or contain doped regions and undoped regions therein.

The first sacrificial layer (not shown) is formed directly atop the underlying substrate layer 112. The first nanosheet 120 is formed directly atop the first sacrificial layer (not shown). The second sacrificial layer (not shown) is formed directly atop the first nanosheet 120. The second nanosheet 130 is formed directly atop the second sacrificial layer (not shown). The third sacrificial layer (not shown) is formed directly atop the second nanosheet 130. The third nanosheet 140 is formed directly atop the third sacrificial layer (not shown). The first sacrificial layer (not shown), the second sacrificial layer (not shown), and the third sacrificial layer (not shown) are hereinafter referred to as the plurality of sacrificial layers (not shown). In addition, the first nanosheet 120, the second nanosheet 130, and the third nanosheet 140 are hereinafter referred to as the plurality of nanosheets 120, 130, 140. The plurality of sacrificial layers (not shown) may be comprised of, for example, SiGe, where Ge is about 35%. The plurality of nanosheets 120, 130, 140 may be comprised of, for example, Si. The number of nanosheets and the number of sacrificial layers described above are not intended to be limiting, and it may be appreciated that in the embodiment of the present invention the number of nanosheets and the number of sacrificial layers may vary. After formation of the plurality of nanosheets 120, 130, 140 and the plurality of sacrificial layers (not shown), together the nanosheet stack, the nanosheet stack (comprising alternative Si and SiGe layers) may be further patterned using conventional lithography and etching processes. After nanosheet stack formation and patterning, the STI region 114 is formed by dielectric filling, CMP, and dielectric recess.

A dummy gate material is deposited and then patterned to form dummy gates (not shown), followed by gate spacer 150 formation by a conformal dielectric liner deposition followed by anisotropic etch. Then, the nanosheet stack at the S/D region 104 is recessed, followed by indentation of sacrificial layers (not shown) and inner spacer 155 formation. Then, the first source/drain 160A, the second source/drain 160B, and the third source/drain 160C are epitaxially grown over exposed sidewalls of the plurality of nanosheets 120, 130, 140, followed by ILD 165 deposition and CMP to remove a dummy gate hard mask (not shown). Then, the sacrificial layers (not shown) are removed, followed by gate 170 formation. The first source/drain 160A, the second source/drain 160B, and the third source/drain 160C are formed directly atop the underlying substrate layer 112.

The first source/drain 160A, the second source/drain 160B, and the third source/drain 160C can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

In FIG. 2, the ILD 165 is formed directly atop the first source/drain 160A and the second source/drain 160B, and surrounds one side of the gate spacer 150. In FIG. 4, the LD 165 is formed directly atop the second source/drain 160B, the third source/drain 160C, and the STI region 114.

In FIG. 2, a gate material is deposited in the space created by the removal of the plurality of sacrificial layers (not shown) and directly atop the third nanosheet 140 to form a replacement gate (i.e., the gate 170). In FIG. 3, the gate material is deposited in the space created by the removal of the plurality of sacrificial layers, and directly atop the third nanosheet 140 and the STI region 114 to form the gate 170. The gate 170 can be comprised of, for example, a gate dielectric liner, such as a high-k dielectric like HfO2, ZrO2, HfLaOx, etc., and work function layers, such as TiN, TiAlC, TiC, etc., and conductive metal fills, like W.

Figure 5:
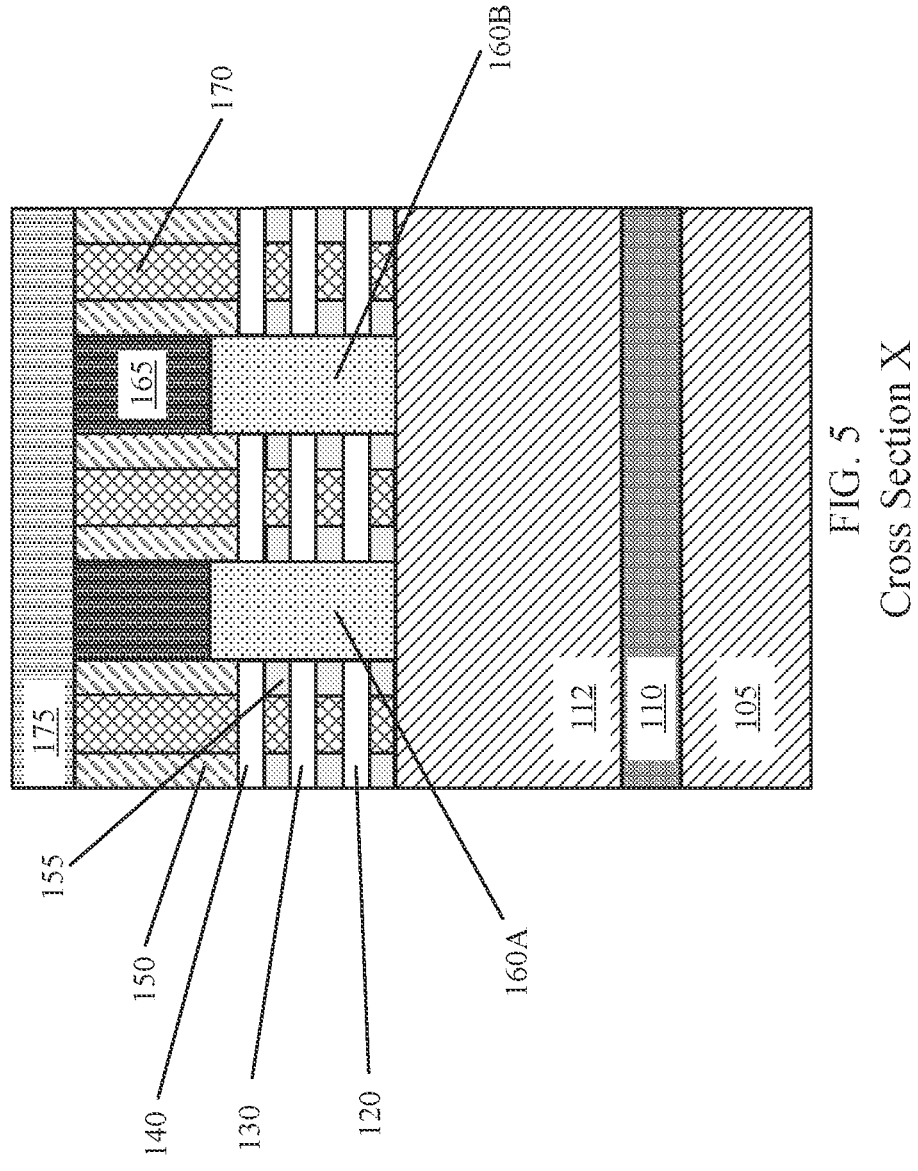
FIGS. 5-7 illustrate cross sections X, $Y_1$, and $Y_2$, respectively, of the plurality of nanodevices after the formation of a hard mask layer and a first trench, in accordance with the embodiment of the present invention.
Figure 7:
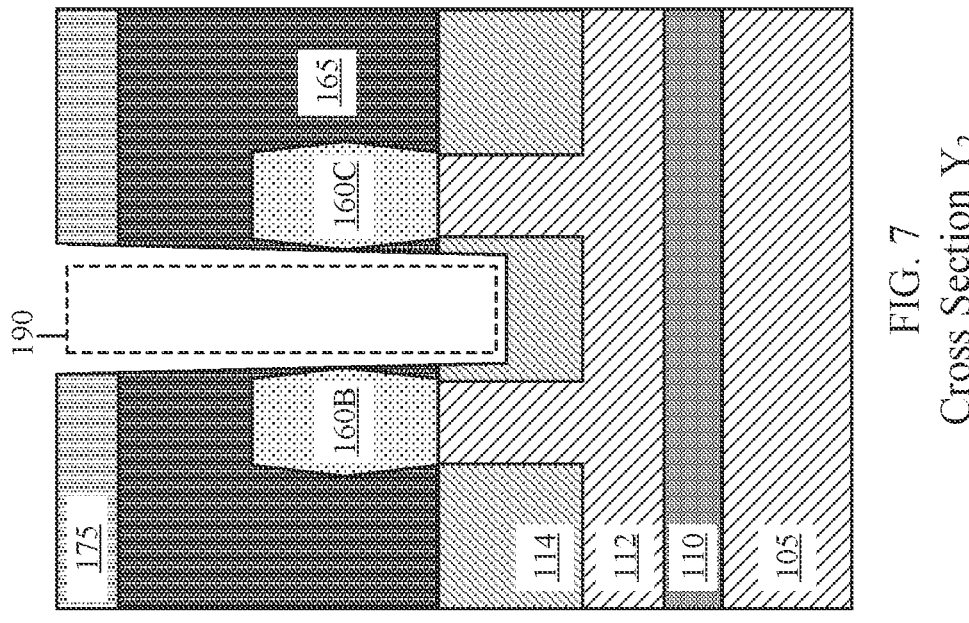
Figure 6:
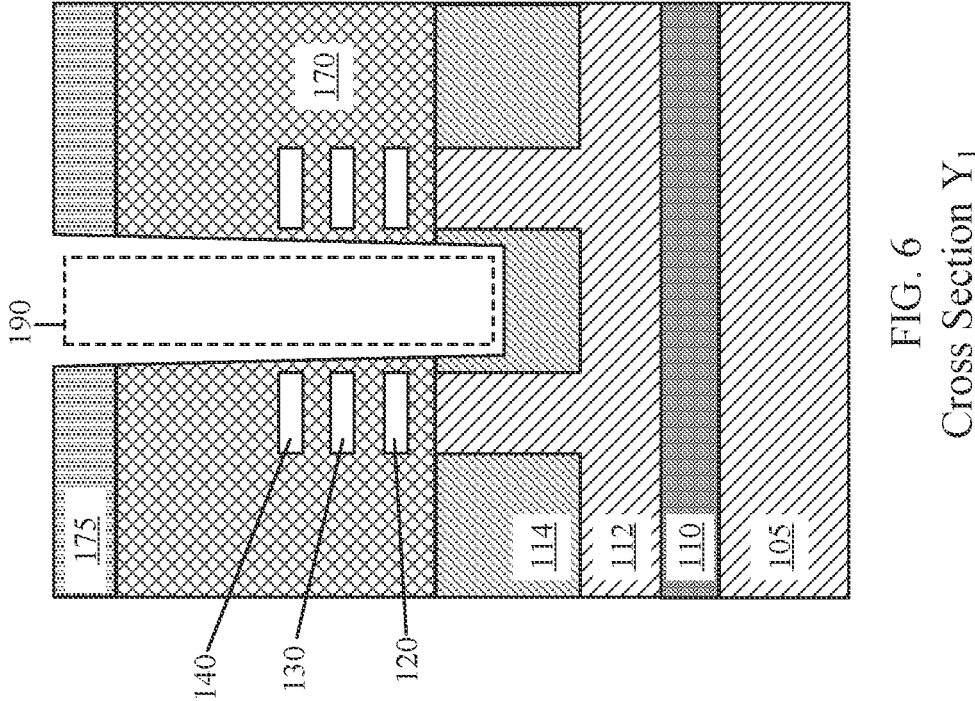

FIGS. 5-7 illustrate cross sections X, $Y_1$, and $Y_2$, respectively, of the plurality of nanodevices ND1, ND2 after the formation of a hard mask layer 175 and a first trench 190, in accordance with the embodiment of the present invention. In FIG. 5, the hard mask layer 185 is deposited directly atop the ILD 165, the gate 170, and the gate spacer 150. In FIG. 6, the hard mask layer 175 is deposited and then patterned directly atop the gate 170 to expose a portion of the underlying gate 170. The exposed portion of the gate 170, and a portion of the STI region 114 are etched to form the first trench 190. In FIG. 7, the hard mask layer 175 is deposited and then patterned directly atop the ILD 165 to expose a portion of the ILD 165. The exposed portion of the ILD 165 and a portion of the STI region 114 are etched to form the first trench 190. In FIGS. 5-7, the hard mask layer 175 is formed by depositing, for example, an organic planarization layer (OPL) material in a spin-on coating process. A bottom surface of the first trench 190 exposes a portion of a top surface of the STI region 114.

Figure 8:
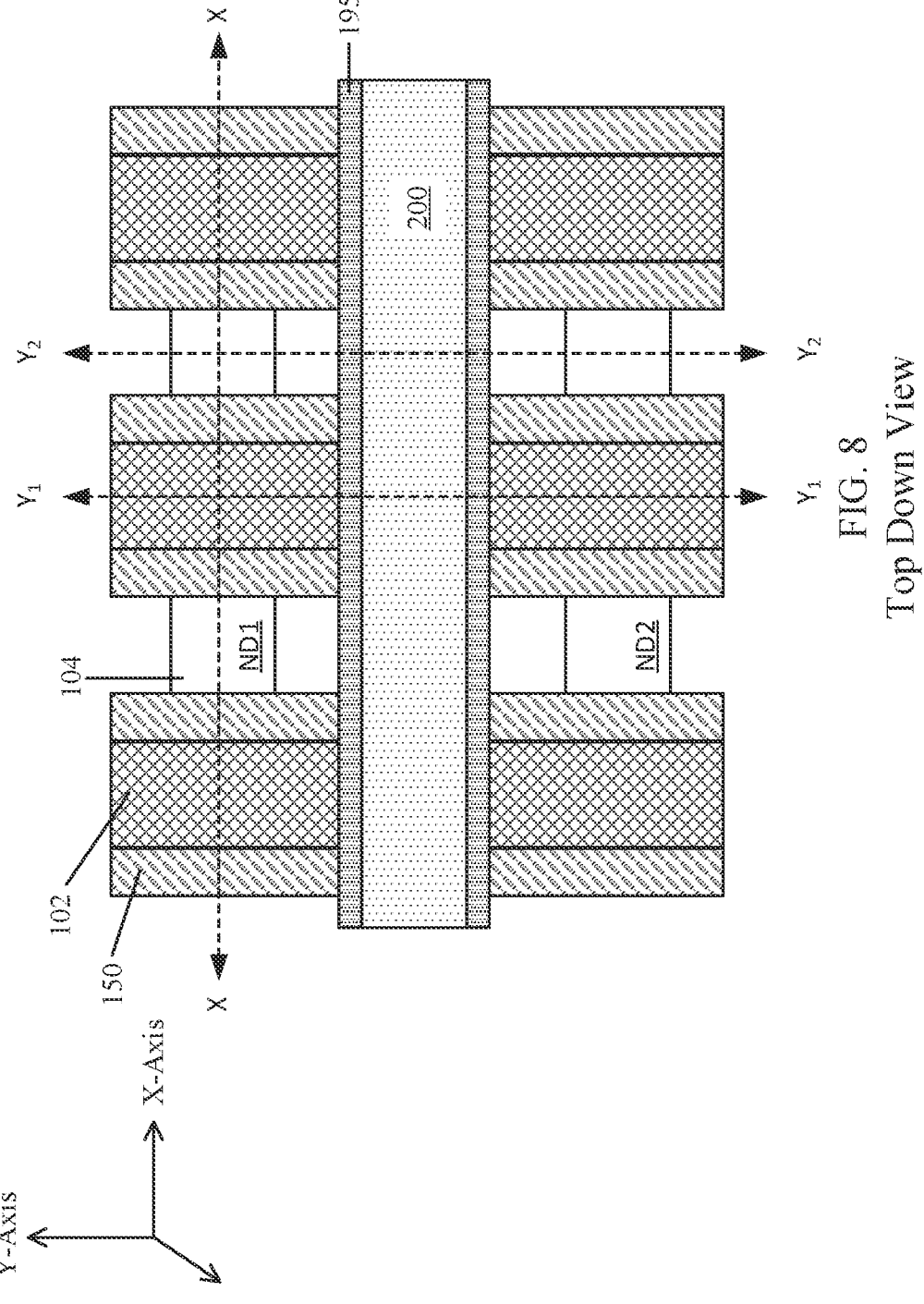
FIG. 8 illustrates a top-down view of the plurality of nanodevices after the formation of a dielectric liner and a dielectric fill, in accordance with the embodiment of the present invention.

FIG. 8 illustrates a top-down view of the plurality of nanodevices ND1, ND2 after the formation of a dielectric liner 195 and a dielectric fill 200, in accordance with the embodiment of the present invention. FIG. 8 is meant to illustrate a cut in the gate region 102 that is filled to form the dielectric liner 195 and the dielectric fill 200. A liner material is deposited in the first trench 190 and etched back to form the dielectric liner 195 located on the sidewalls of the first trench 190. The dielectric liner 195 is comprised of a first dielectric liner and a second dielectric liner. The dielectric liner 195 may be comprised of, for example, SiC. Then, a dielectric fill material is deposited in the first trench 190 to form the dielectric fill 200 located on the sidewalls of the dielectric liner 195. The dielectric fill 200 may be comprised of, for example, $SiO_2$. The dielectric fill 200 is located between the first nanodevice ND1 and the second nanodevice ND2. The first dielectric liner is located between the first nanodevice ND1 and the dielectric fill 200. The second dielectric liner is located between the second nanodevice ND2 and the dielectric fill 200.

Figure 9:
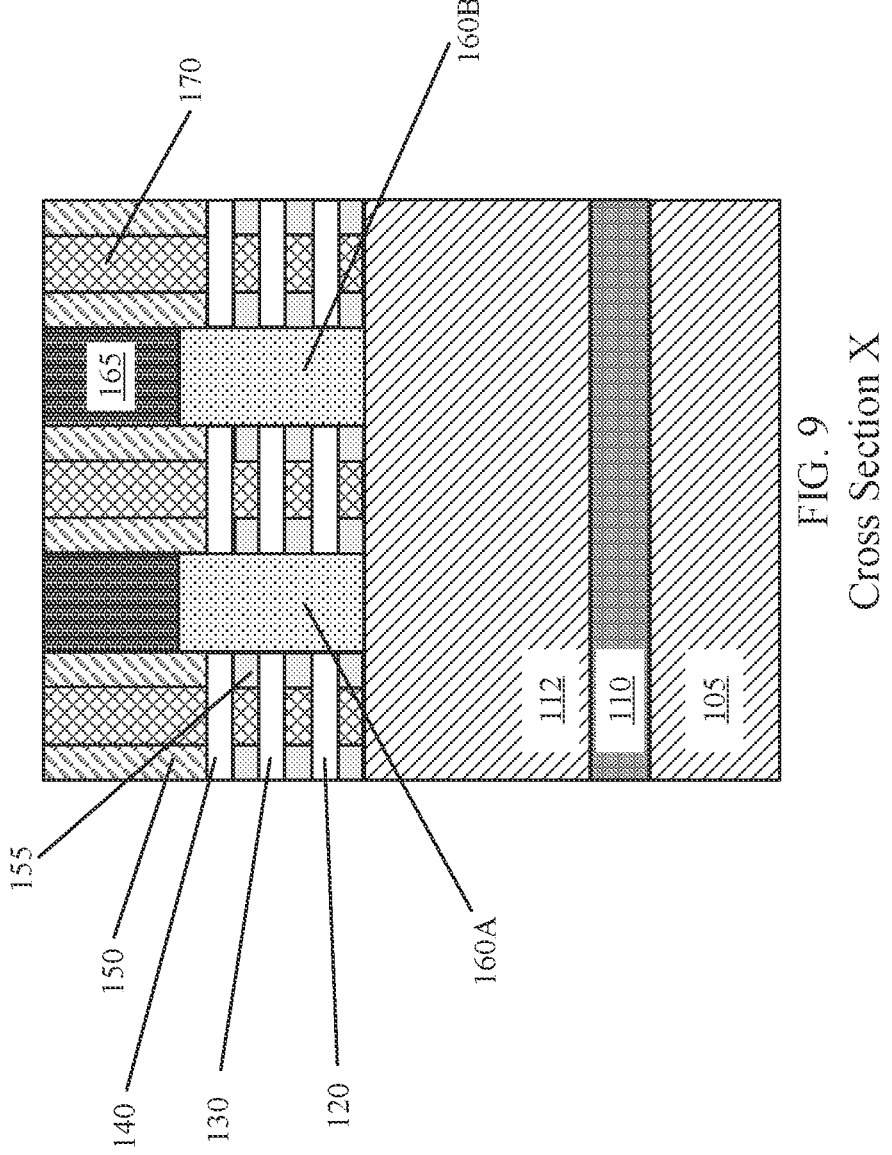
FIGS. 9-11 illustrate cross sections X, $Y_1$, and $Y_2$, respectively, of the plurality of nanodevices after the formation of the dielectric liner and the dielectric fill, in accordance with the embodiment of the present invention.
Figure 11:
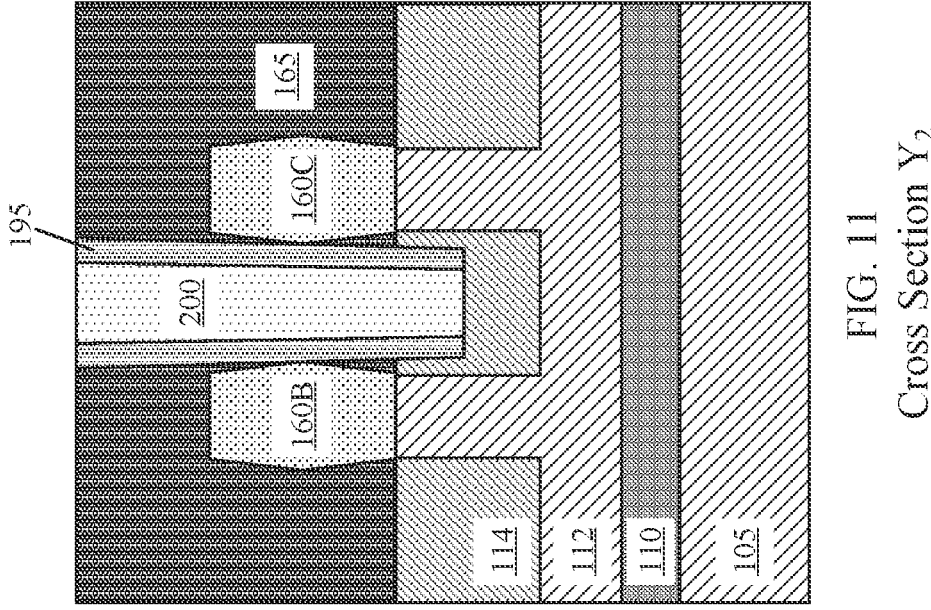
Figure 10:
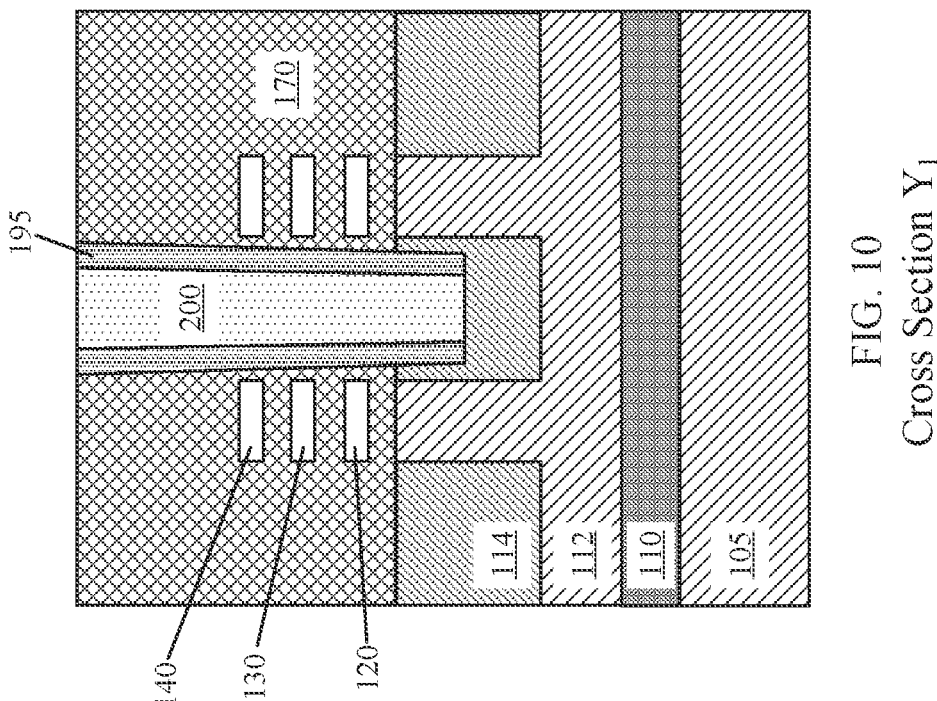

FIGS. 9-11 illustrate cross sections X, $Y_1$, and $Y_2$, respectively, of the plurality of nanodevices ND1, ND2 after the formation of the dielectric liner 195 and the dielectric fill 200, in accordance with the embodiment of the present invention. The hard mask layer 175 is removed. The hard mask layer 175 may be removed by, for example, RIE. As described above with respect to the description of FIG. 8, the liner material is deposited in the first trench 190 and etched back to form the dielectric liner 195 located on the sidewalls of the first trench 190. In FIG. 10, a portion of the sidewalls of the dielectric liner 195 is in contact with the STI region 114, or the gate 170, respectively. In FIG. 11, a portion of the sidewalls of the dielectric liner 195 is in contact with the STI region 114, the second source/drain 160B and the third source/drain 160C, or the ILD 165, respectively. Then, as described above with respect to the description of FIG. 8, the dielectric fill material is deposited in the first trench 190 to form the dielectric fill 200 located on the sidewalls of the dielectric liner 195. In FIGS. 10 and 11, a bottom surface of the dielectric fill 200 is in contact with the STI region 114.

Figure 12:
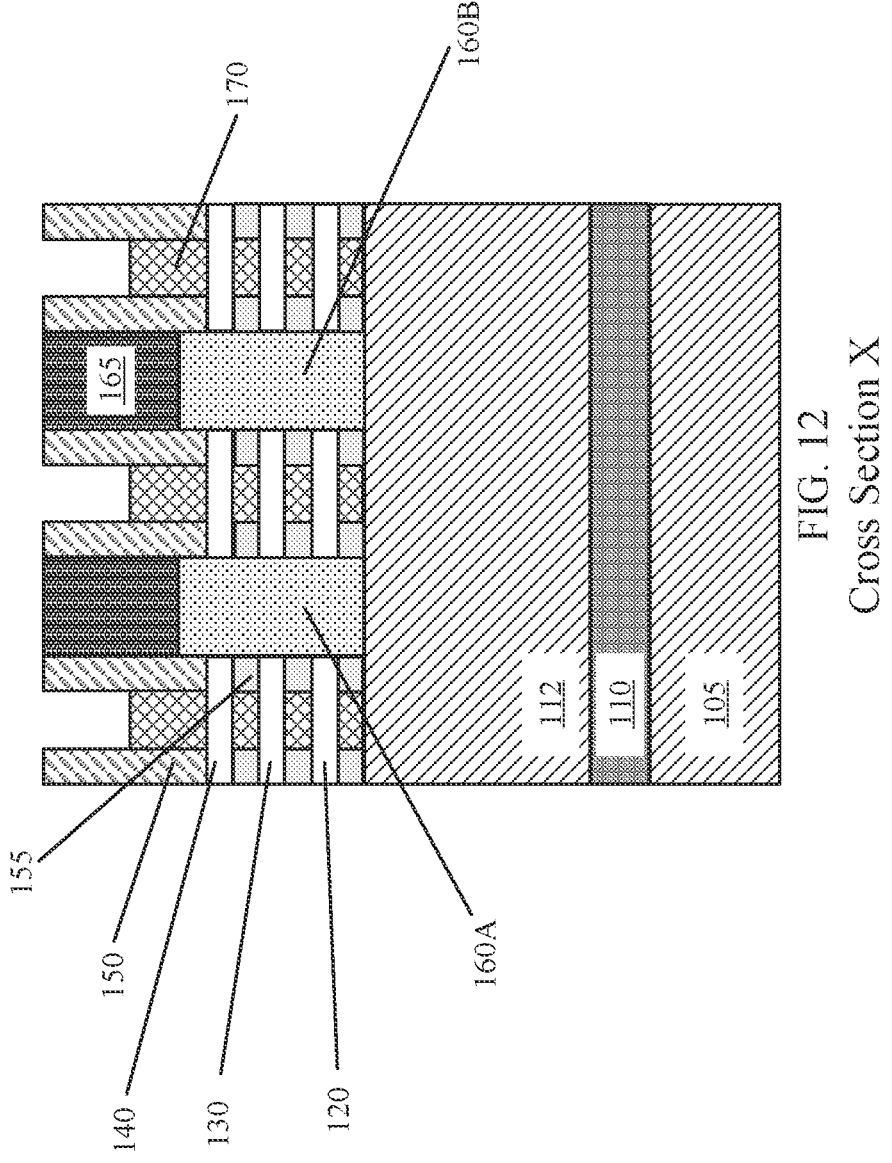
FIGS. 12-14 illustrate cross sections X, $Y_1$, and $Y_2$, respectively, of the plurality of nanodevices after the selective recessing of the gate, in accordance with the embodiment of the present invention.
Figure 14:
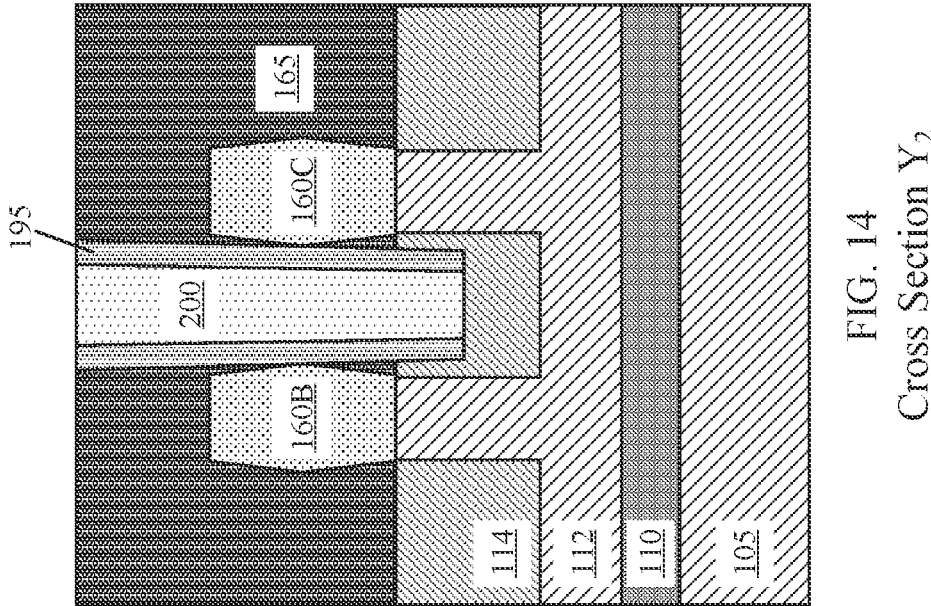
Figure 13:
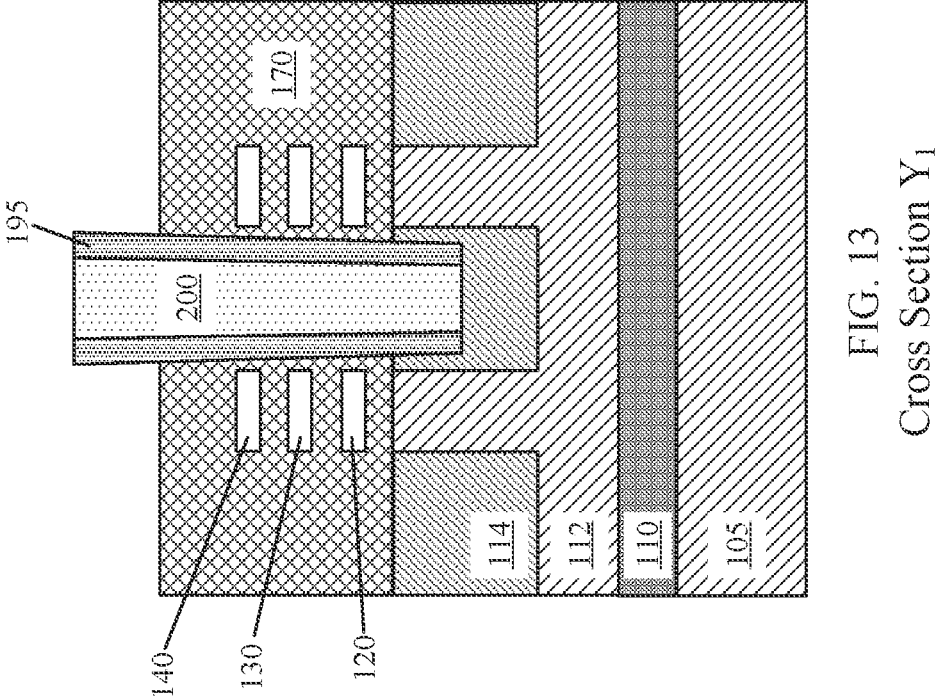

FIGS. 12-14 illustrate cross sections X, $Y_1$, and $Y_2$, respectively, of the plurality of nanodevices ND1, ND2 after the selective recessing of the gate 170, in accordance with the embodiment of the present invention. A portion of the gate 170 is removed by, for example, RIE. In FIG. 13, a portion of the dielectric liner 195 and the dielectric fill 200 are located above the gate 170.

Figure 15:
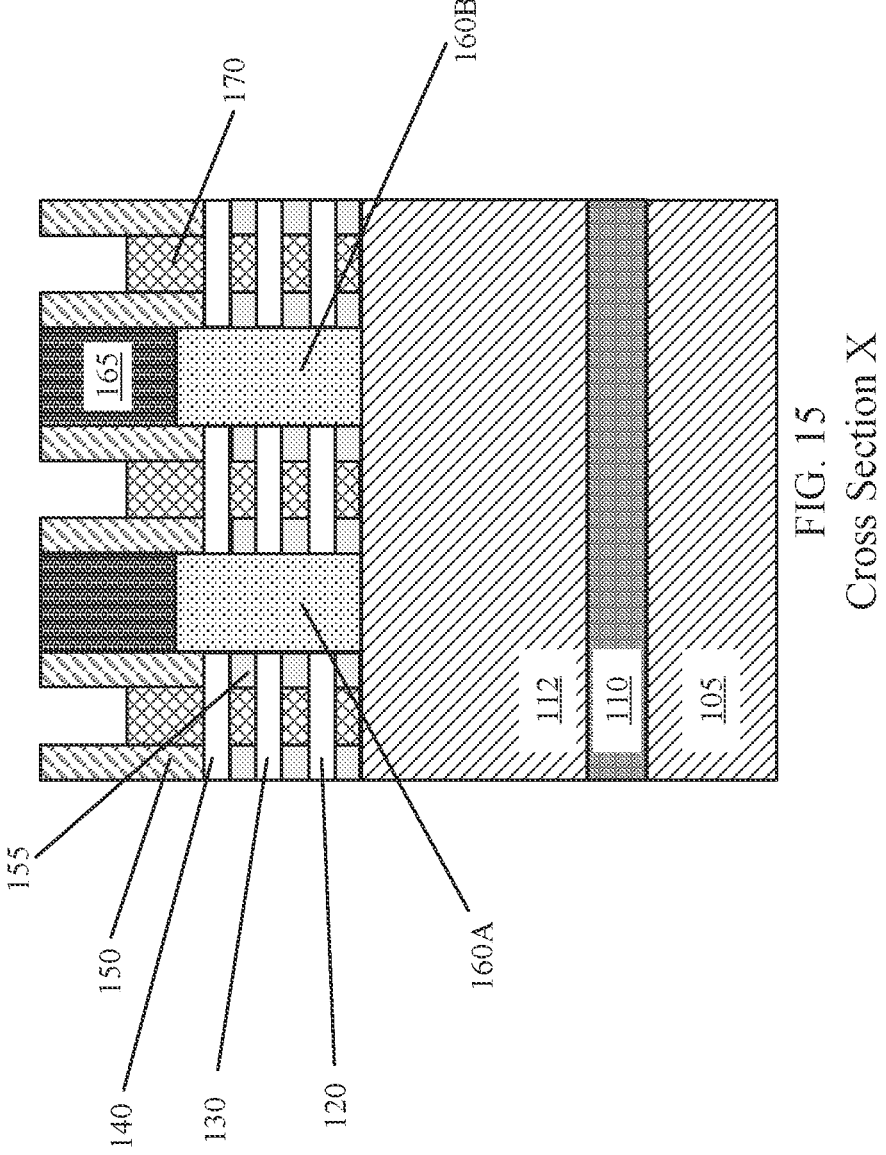
FIGS. 15-17 illustrate cross sections X, $Y_1$, and $Y_2$, respectively, of the plurality of nanodevices after the selective recessing of the dielectric liner, in accordance with the embodiment of the present invention.
Figure 17:
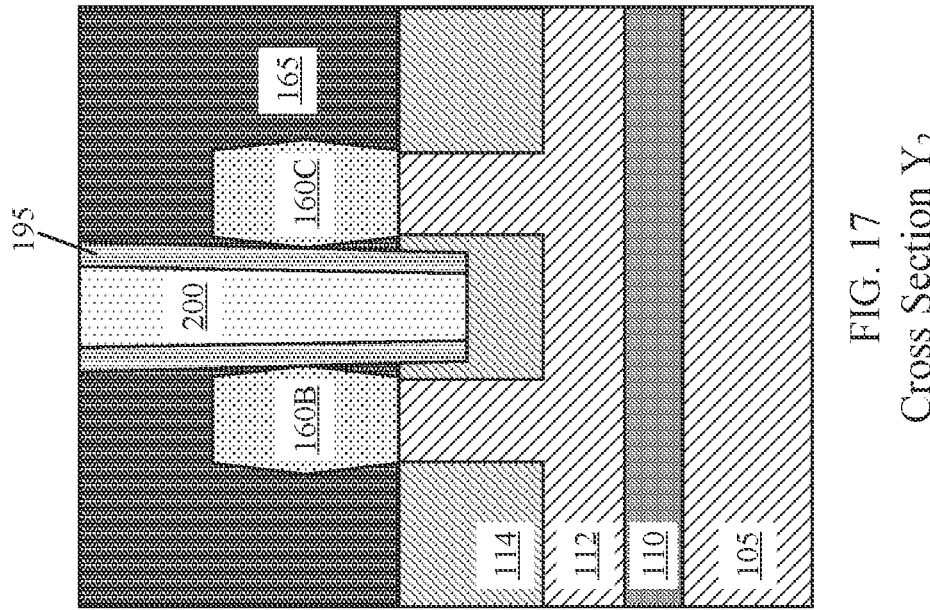
Figure 16:
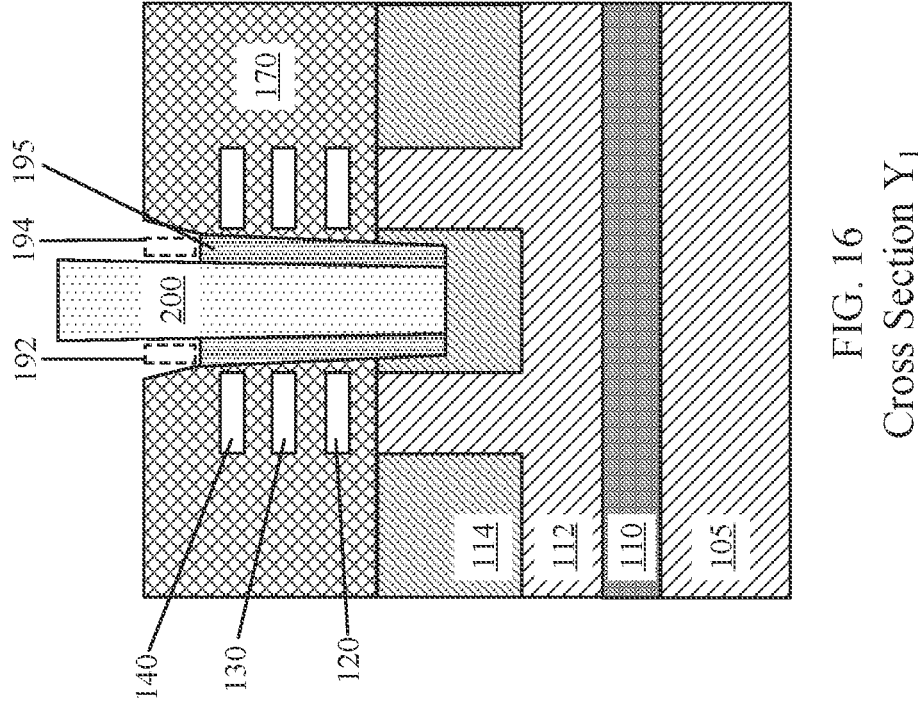

FIGS. 15-17 illustrate cross sections X, $Y_1$, and $Y_2$, respectively, of the plurality of nanodevices ND1, ND2 after the selective recessing of the dielectric liner 195, in accordance with the embodiment of the present invention. The exposed portion of the dielectric liner 195 is etched by, for example, RIE to form the second trench 192 and the third trench 194. A bottom surface of the second trench 192 and the third trench 194 exposes a top surface of the dielectric liner 195. In FIG. 16, the top surface of the dielectric liner 195 is located below a top surface of the gate 170.

Figure 18:
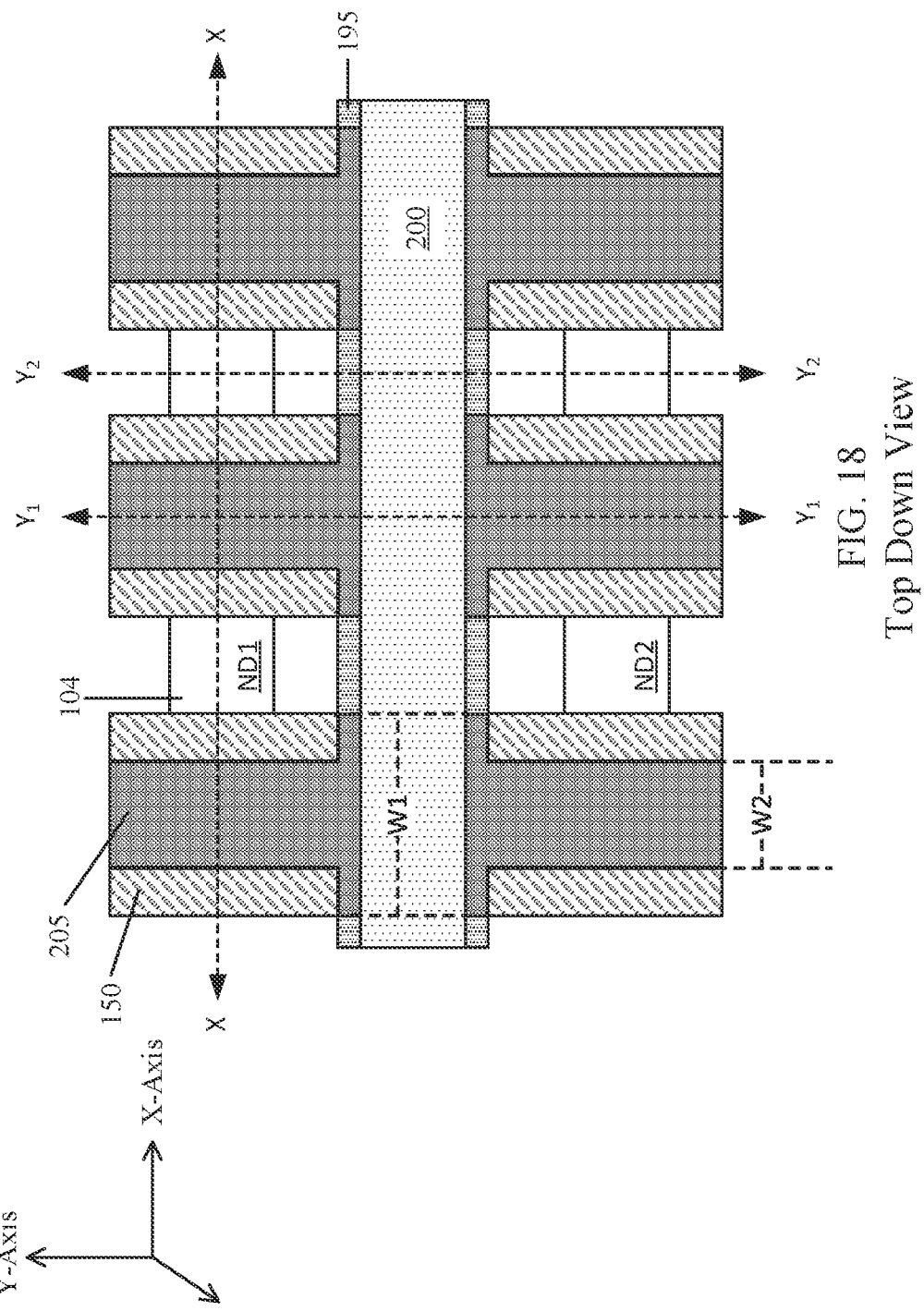
FIG. 18 illustrates a top-down view of the plurality of nanodevices after the formation of a self-aligned contact (SAC) cap, in accordance with the embodiment of the present invention.

FIG. 18 illustrates a top-down view of the plurality of nanodevices ND1, ND2 after the formation of a self-aligned contact (SAC) cap 205, in accordance with the embodiment of the present invention. FIG. 18 is meant to illustrate a recess in that gate 170 and the dielectric liner 195 that is filled to form a plurality of SAC caps 205. A dielectric material is deposited in the second trench 192 and the third trench 194 to form the plurality of SAC caps 205 directly atop the dielectric liner 195 and directly atop the gate 170. The plurality of SAC caps 205 may be comprised of, for example, SiN. The plurality of SAC caps 205 may be comprised of a head section and a shaft section. The head section of each SAC cap 205 extends a first width W1 parallel to the x-axis. The head section of each SAC cap 205 is in direct contact with a frontside of the dielectric liner 195. The shaft section of each SAC cap 205 extends a second width W2 parallel to the x-axis. The first width W1 is greater than the second width W2. The shaft section of each SAC cap 205 that is in direct contact with the first dielectric liner extends upwards along the y-axis from where the head section connects to the shaft section through the first nanodevice ND1. The shaft section of each SAC cap 205 that is in direct contact with the second dielectric liner extends downwards along the y-axis from where the head section connects to the shaft section through the second nanodevice ND2. The head section and the shaft section of the plurality of SAC caps 205 have a T-shape. At least a portion of the head section of each SAC cap 205 is in direct contact with the dielectric fill 200. A plurality of gate spacers 150 are in direct contact with the head section and the shaft section of each SAC cap 205. Each gate spacer 150 is defined by a recess. The head section of each SAC cap 205 extends parallel to the x-axis through the gate spacer 150 recess to connect to the frontside of the dielectric liner 195. Each gate spacer 150 is located in a seat of the "T".

Figure 19:
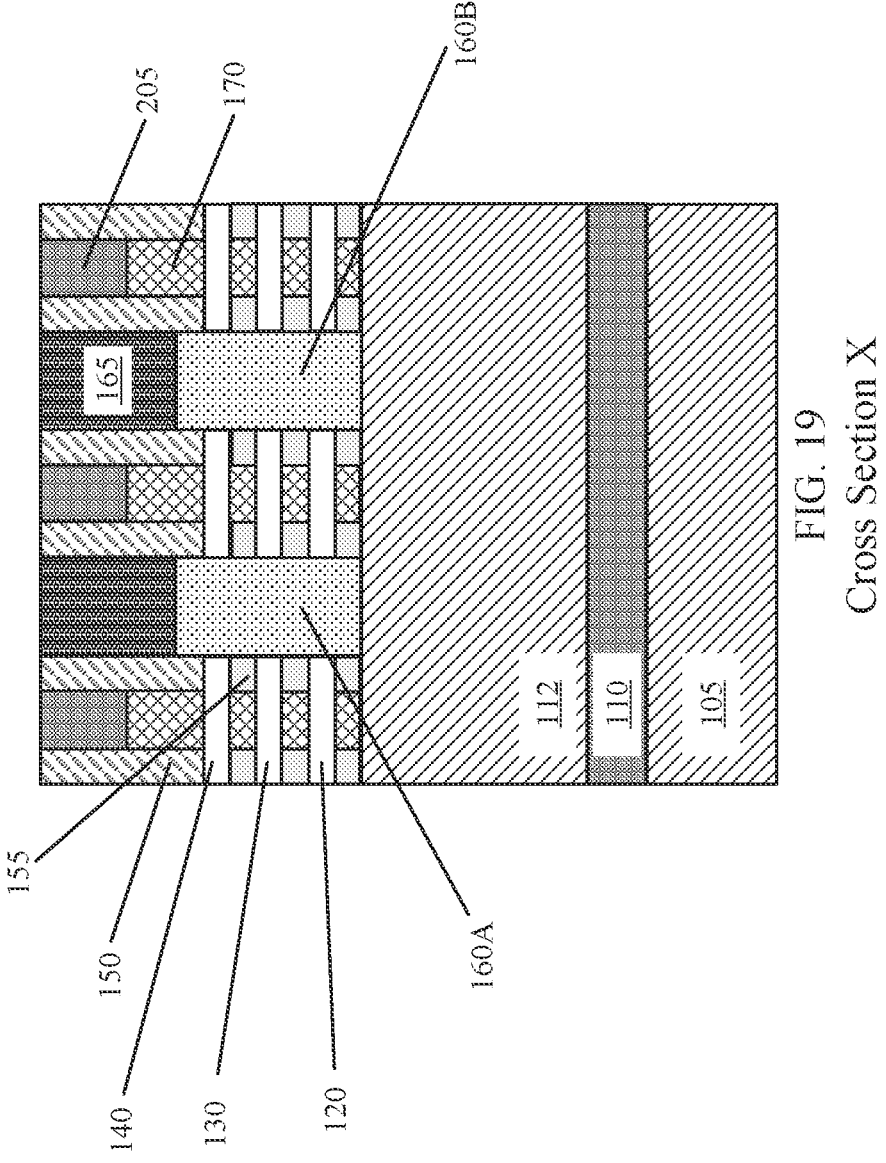
FIGS. 19-21 illustrate cross sections X, $Y_1$, and $Y_2$, respectively, of the plurality of nanodevices after the formation of the SAC cap, in accordance with the embodiment of the present invention.
Figure 21:
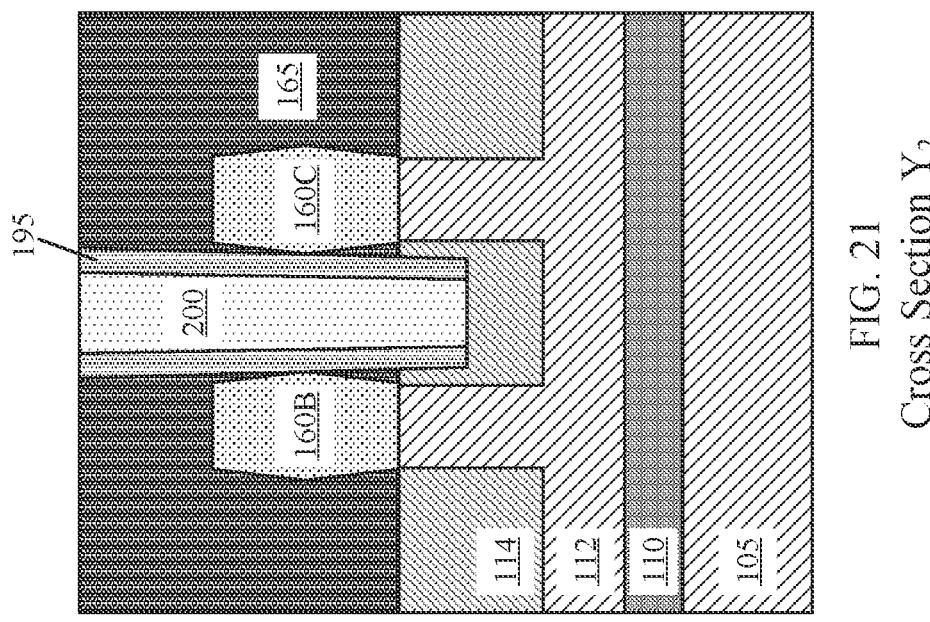
Figure 20:
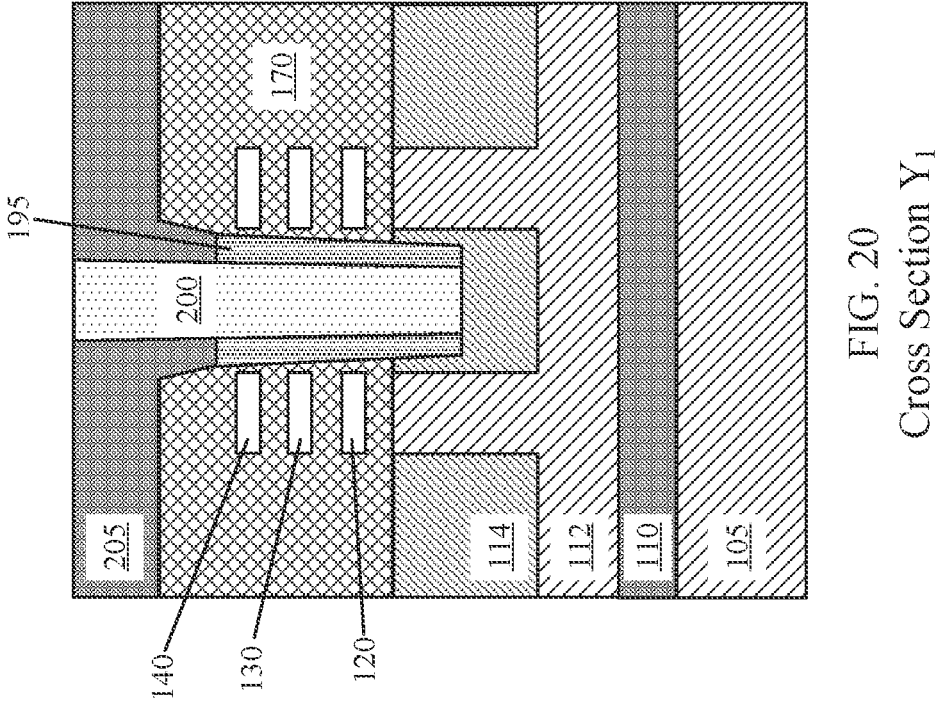

FIGS. 19-21 illustrate cross sections X, Y₁, and Y₂, respectively, of the plurality of nanodevices ND1, ND2 after the formation of the SAC cap 205, in accordance with the embodiment of the present invention. In FIG. 19, the plurality of SAC caps 205 are formed directly atop the gate 170. In FIG. 20, the plurality of SAC caps 205 are formed directly atop the dielectric liner 195 and the gate 170. Each of the first dielectric liner and the second dielectric liner are defined by a recess. The head section of each SAC cap 205 extends downwards through the recess to connect to the frontside of the dielectric liner.

Figure 22:
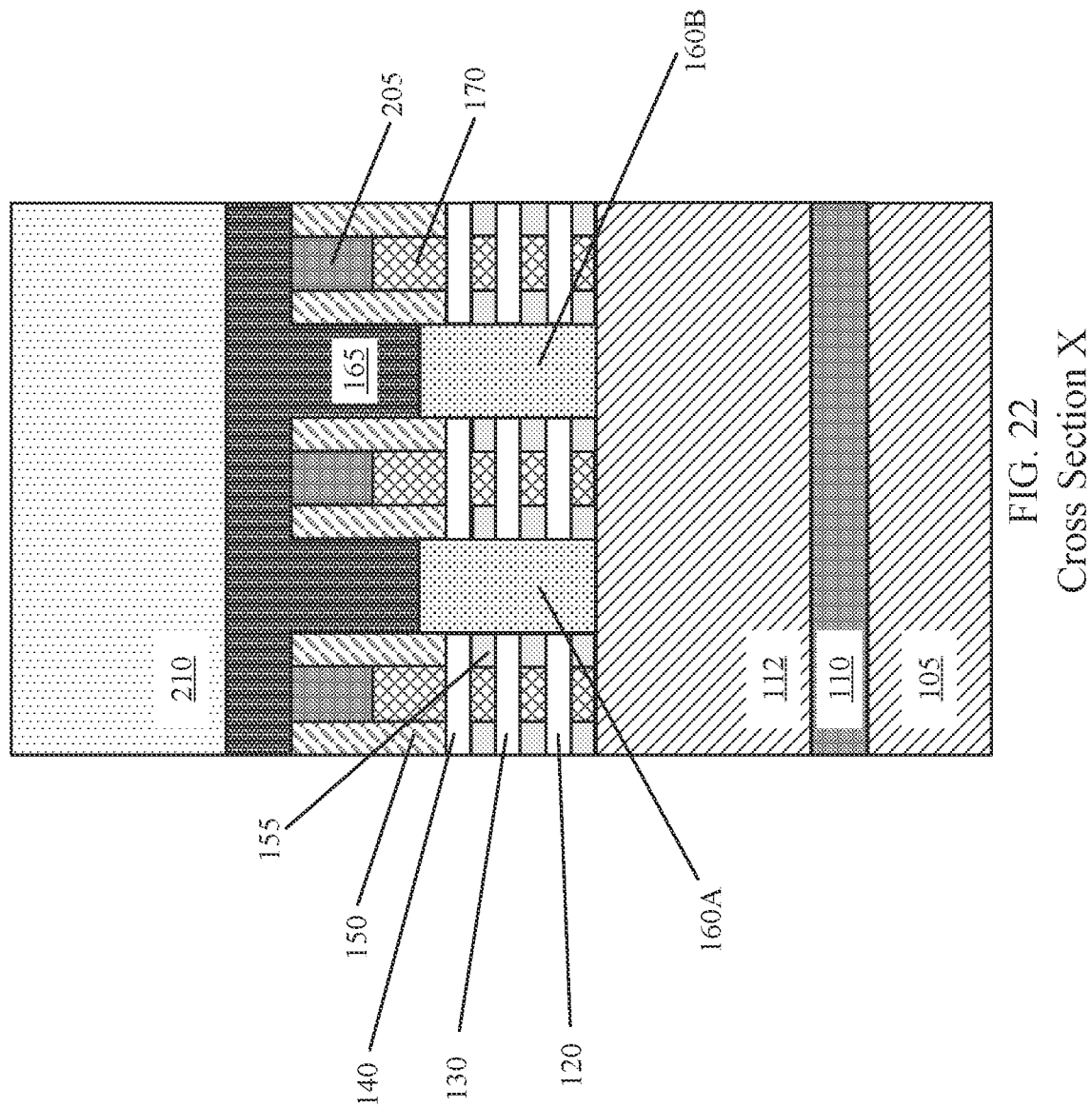
FIGS. 22-24 illustrate cross sections X, $Y_1$, and $Y_2$, respectively, of the plurality of nanodevices after the formation of a lithography mask layer and a fourth trench, in accordance with the embodiment of the present invention.
Figures 23, 24:
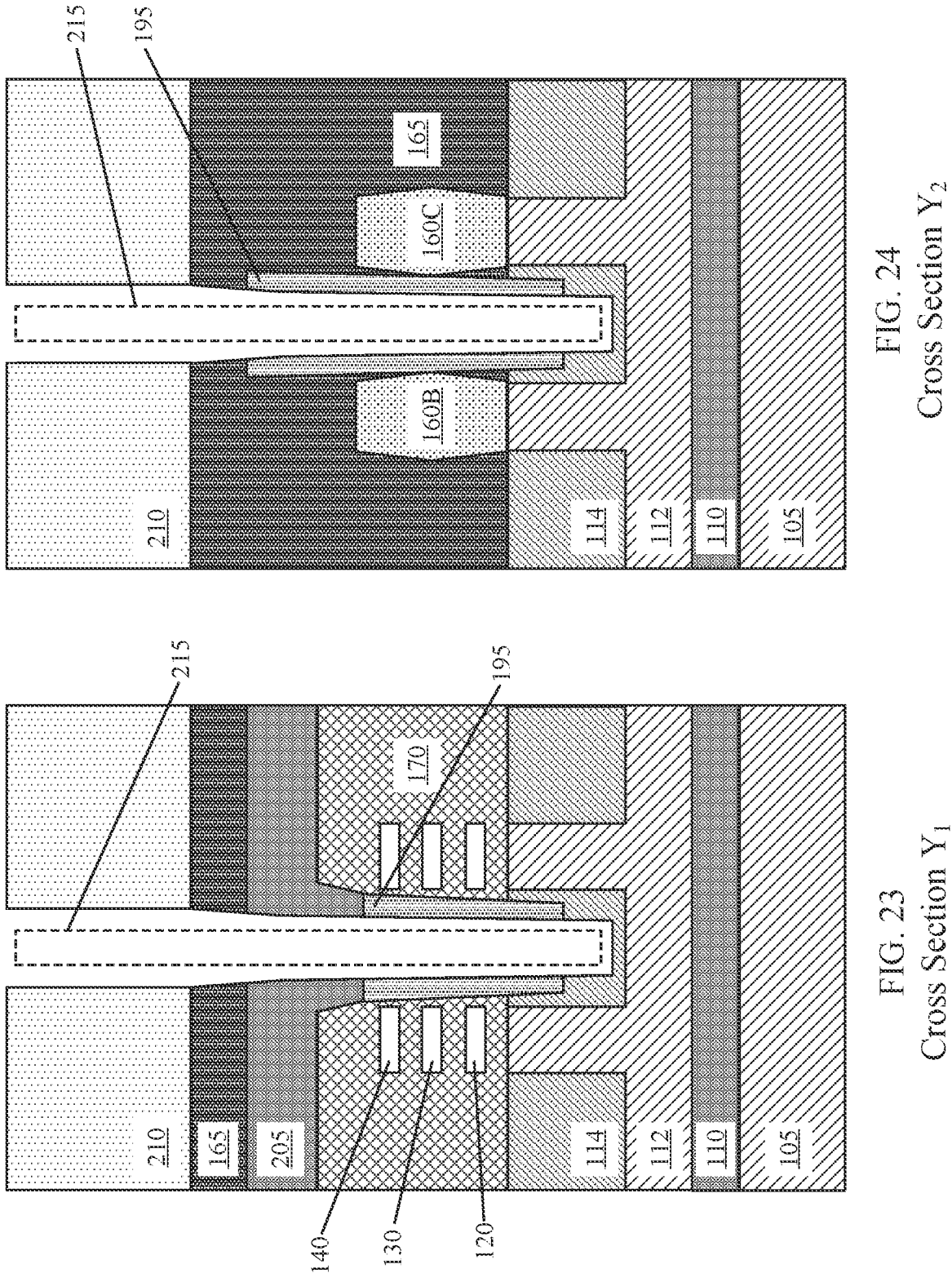

FIGS. 22-24 illustrate cross sections X, Y₁, and Y₂, respectively, of the plurality of nanodevices ND1, ND2 after the formation of a lithography mask layer 210 and a fourth trench 215, in accordance with the embodiment of the present invention. In FIG. 22, an additional ILD is deposited directly atop the SAC cap 205, the gate spacer 150, and the ILD 165. The lithography mask layer 210, for example, an organic planarization layer (OPL), is deposited directly atop the additional ILD. In FIG. 23, the additional ILD is deposited directly atop the SAC cap 205. The lithography mask layer 210 is deposited and then patterned directly atop the additional ILD to expose a portion of the underlying additional ILD. The exposed portion of the additional ILD and the dielectric fill 200 are etched by, for example, oxide etch to form the fourth trench 215. In FIG. 24, the additional ILD is deposited directly atop the dielectric liner 195 and the ILD 165. The lithography mask layer 210 is deposited and then patterned directly atop the additional ILD. The exposed portion of the additional ILD and the dielectric fill 200 are etched by, for example, oxide etch to form the fourth trench 215. In FIGS. 22-24, the lithography mask layer 210 is formed by depositing, for example, an OPL material in a spin-on coating process. A bottom surface of the fourth trench 215 exposes a portion of the STI region 114.

Figure 25:
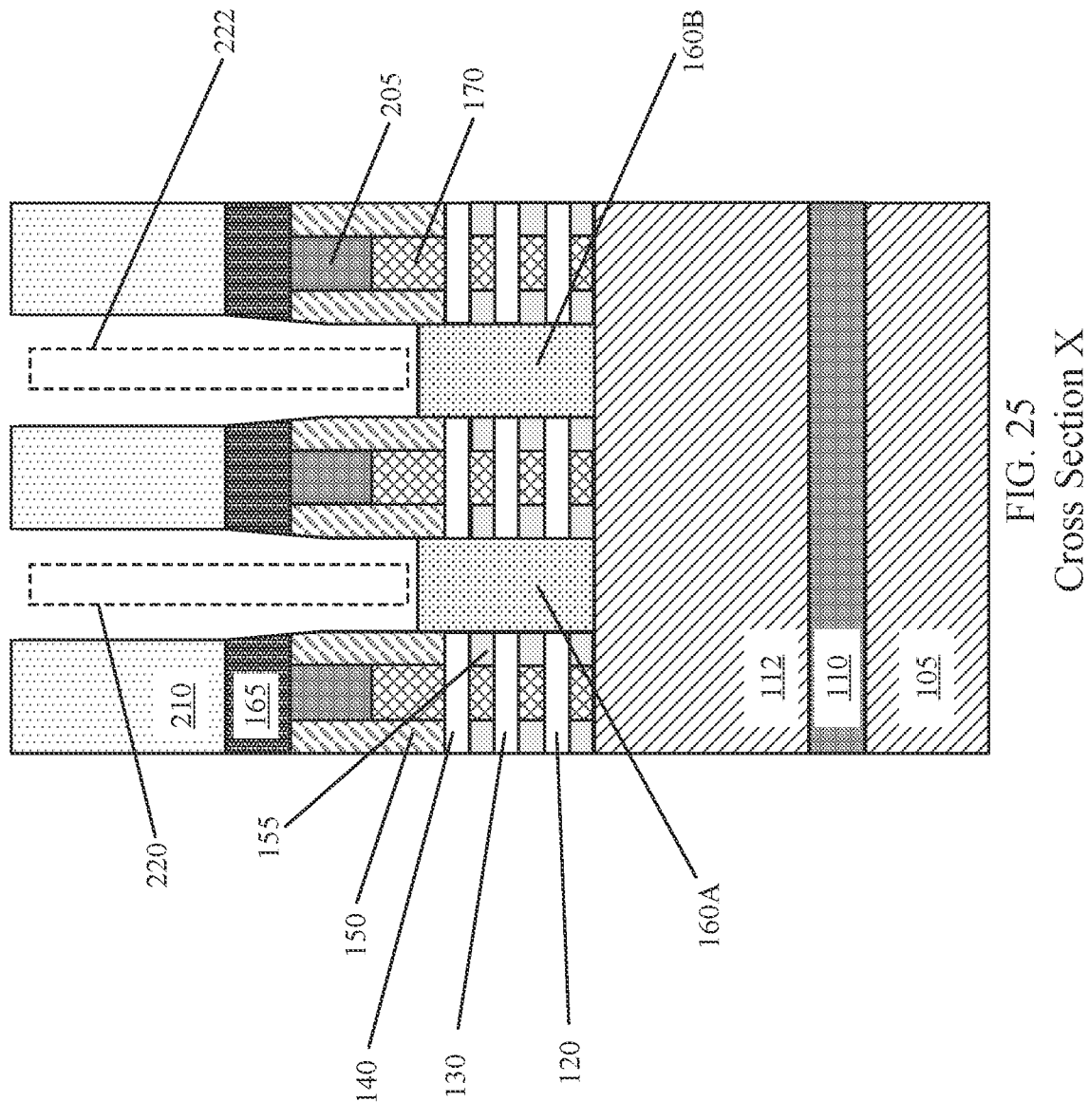
FIGS. 25-27 illustrate cross sections X, $Y_1$, and $Y_2$, respectively, of the plurality of nanodevices after the formation of a fifth trench, sixth trench, and seventh trench, in accordance with the embodiment of the present invention.
Figures 26, 27:
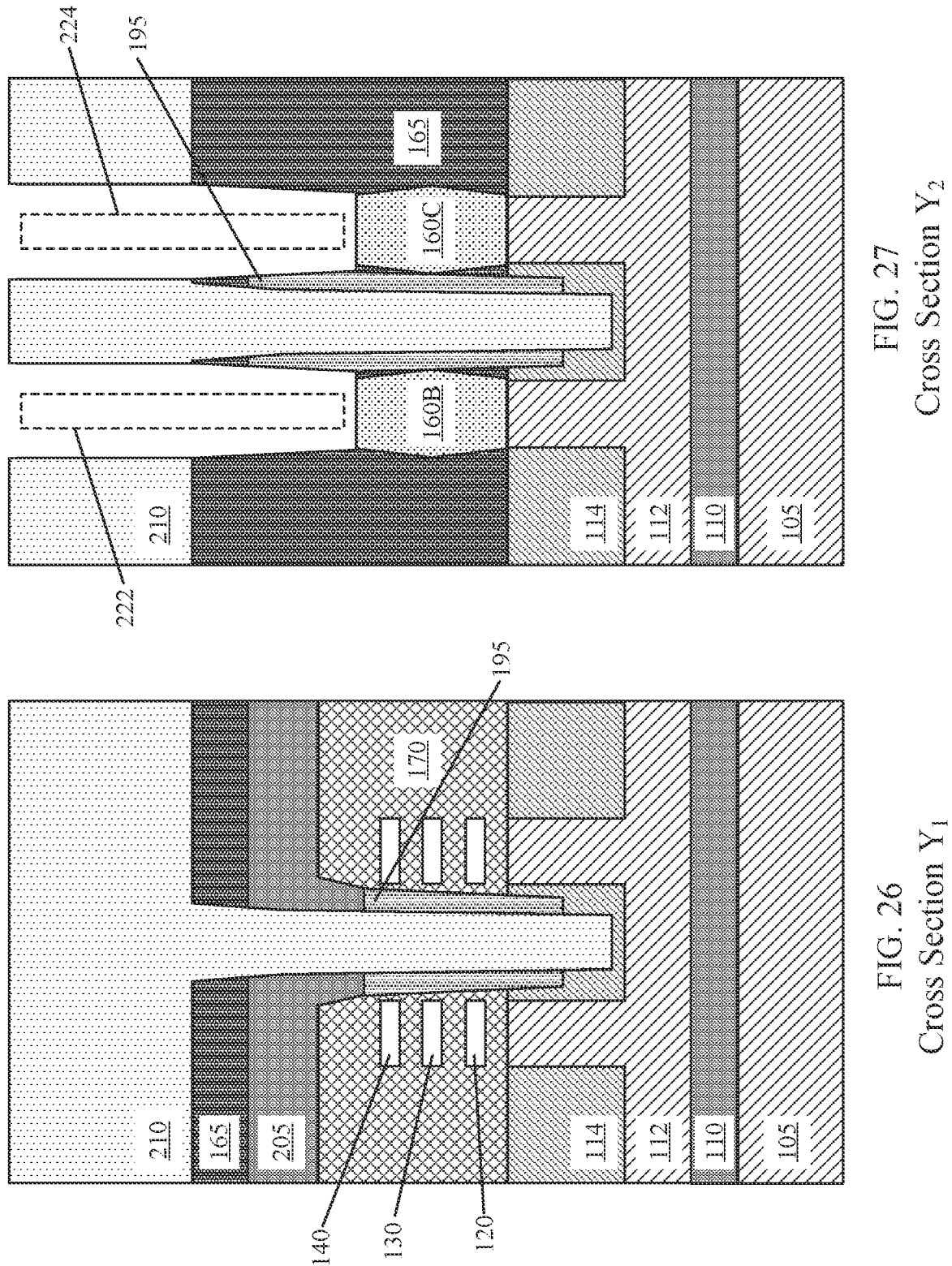

FIGS. 25-27 illustrate cross sections X, Y₁, and Y₂, respectively, of the plurality of nanodevices ND1, ND2 after the formation of a fifth trench 220, sixth trench 222, and seventh trench 224, in accordance with the embodiment of the present invention. In FIG. 25, the lithography mask layer 210 is patterned to expose a portion of the underlying additional ILD. The exposed portion of the additional ILD and the ILD 165 are etched to form the fifth trench 220 and the sixth trench 222. A bottom surface of the fifth trench 220 and the sixth trench 222 exposes a top surface of the first source/drain 160A and the second source/drain 160B, respectively. In FIG. 26, the OPL material is deposited in the fourth trench 215 to fill the fourth trench 215. In FIG. 27, the OPL material is deposited in the fourth trench 215 to fill the fourth trench 215. The lithography mask layer 210 is then patterned directly atop the additional ILD to expose a portion of the additional ILD. The exposed portion of the additional ILD and a portion of the ILD 165 are etched to form the sixth trench 222 and the seventh trench 224. A bottom surface of the sixth trench 222 and the seventh trench 224 exposes a top surface of the second source/drain 160B and the third source/drain 160C, respectively.

Figure 28:
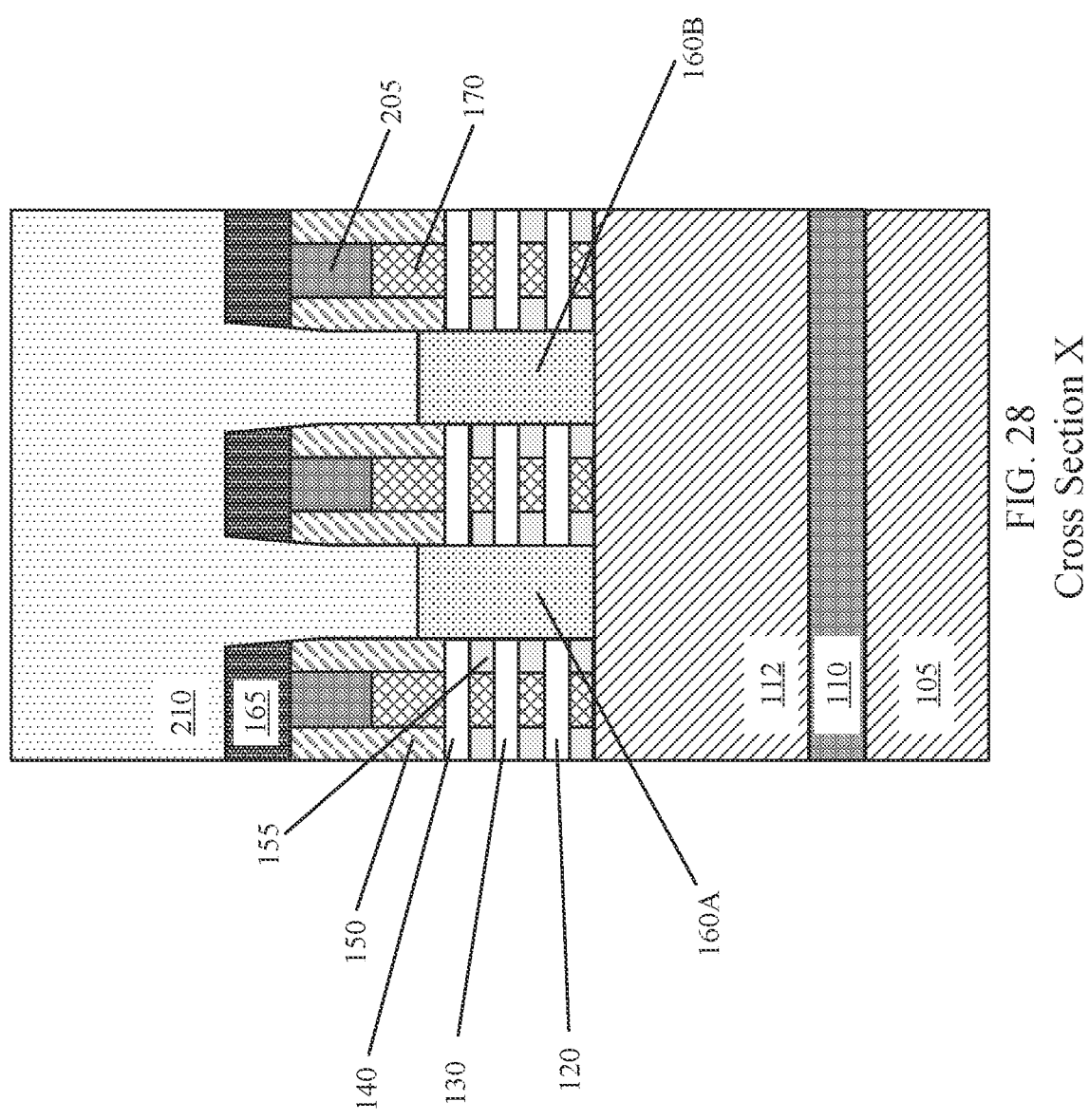
FIGS. 28-30 illustrate cross sections X, $Y_1$, and $Y_2$, respectively, of the plurality of nanodevices after the formation of an eighth trench, in accordance with the embodiment of the present invention.
Figures 29, 30:
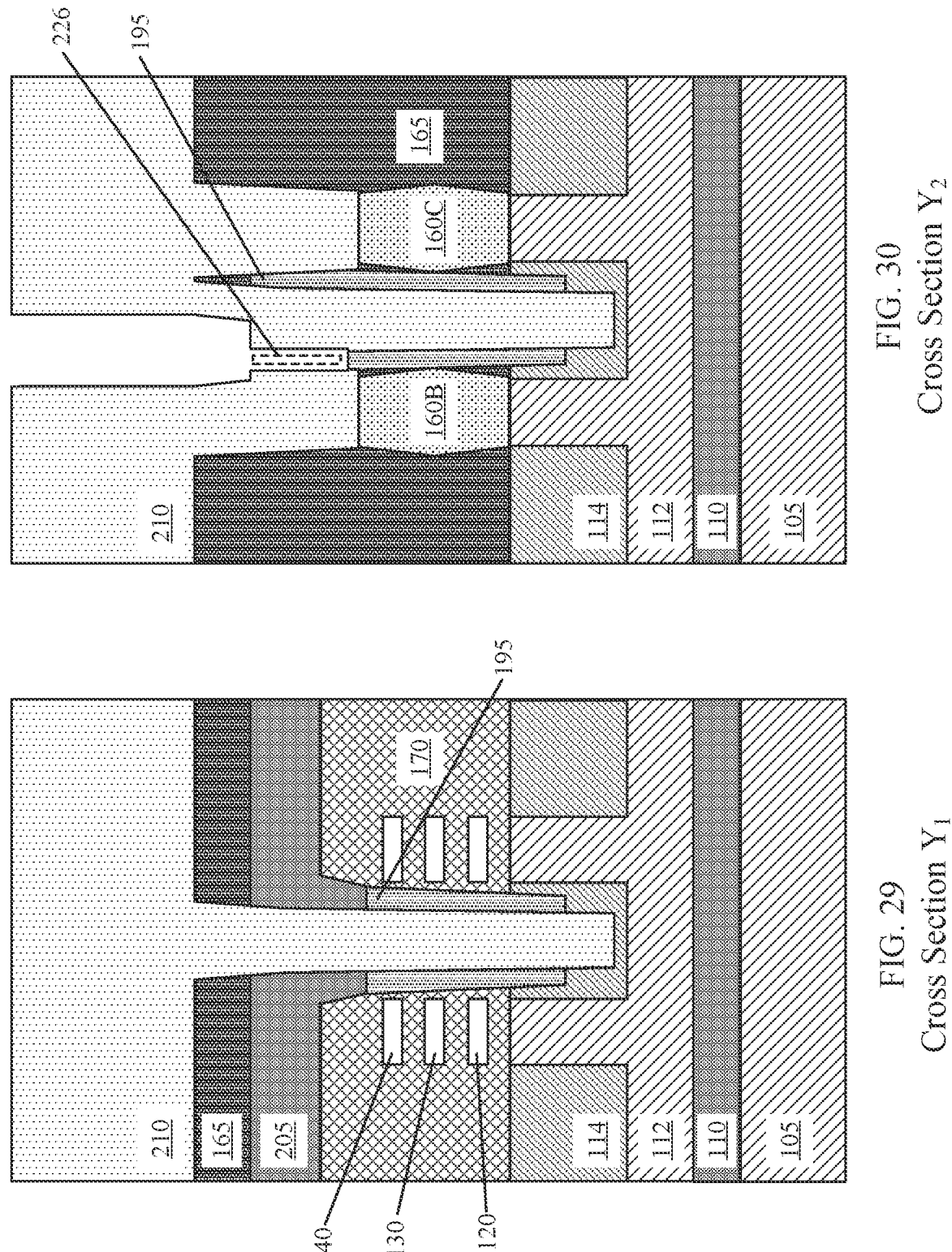

FIGS. 28-30 illustrate cross sections X, Y₁, and Y₂, respectively, of the plurality of nanodevices ND1, ND2 after the formation of an eighth trench 226, in accordance with the embodiment of the present invention. In FIG. 28, the OPL material is deposited in the fifth trench 220 and the sixth trench 222 to fill the fifth trench 220 and the sixth trench 222. In FIG. 30, the OPL material is deposited in the sixth trench 222 and the seventh trench 224 to fill the sixth trench 222 and the seventh trench 224. The lithograph mask layer 210 is then patterned directly atop the LD 165 to expose a portion of the first dielectric liner. The exposed portion of the first dielectric liner is etched by, for example, RIE to form the eighth trench 226. A bottom surface of the eighth trench 226 exposes the top surface of the first dielectric liner.

Figure 31:
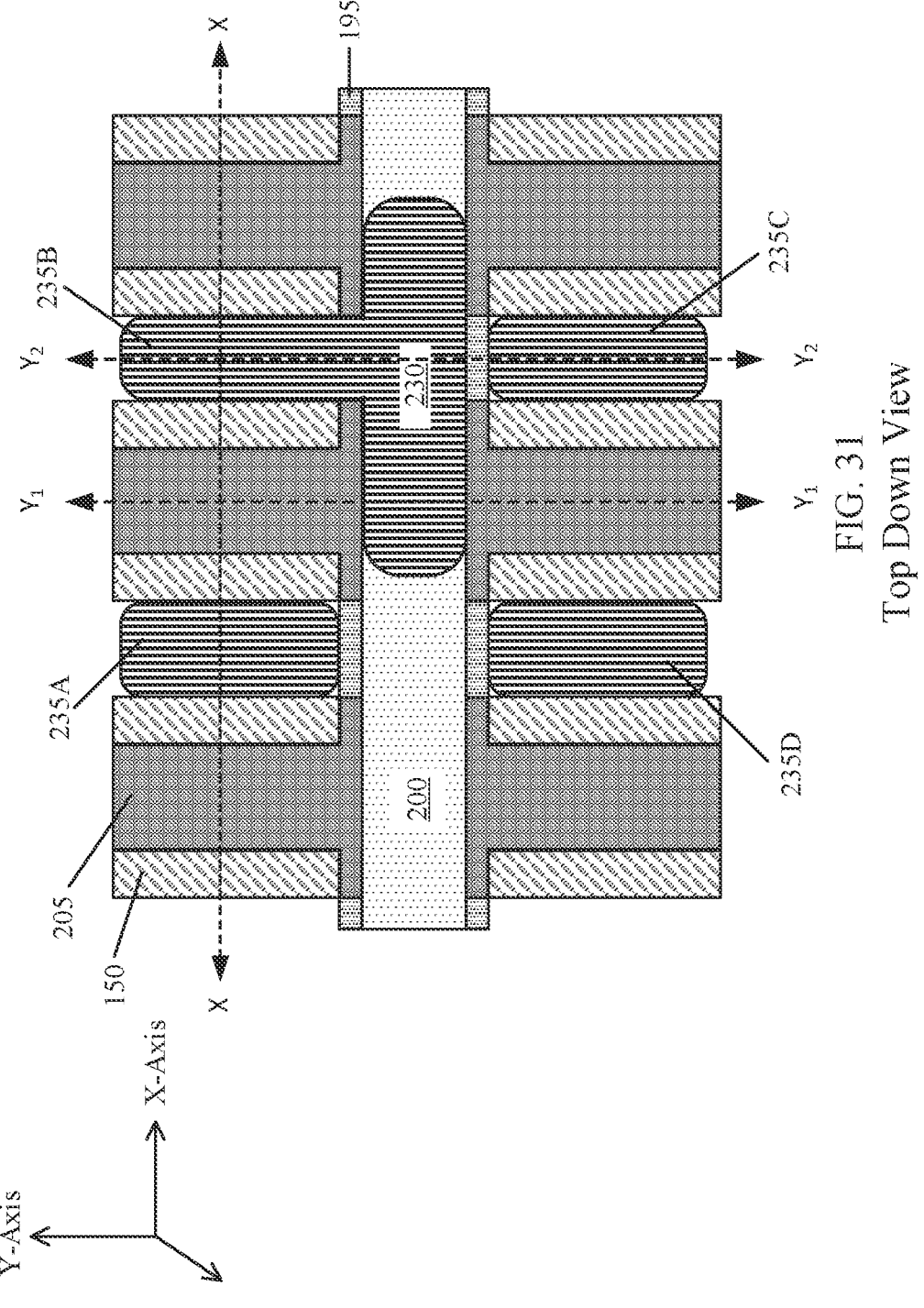
FIG. 31 illustrates a top-down view of the plurality of nanodevices after the formation of a via to the backside power rail (VBPR) and a plurality of source/drain contacts, in accordance with the embodiment of the present invention.

FIG. 31 illustrates a top-down view of the plurality of nanodevices ND1, ND2 after the formation of the VBPR 230 and a plurality of source/drain contacts 235A, 235B, 235C, 235D, in accordance with the embodiment of the present invention. FIG. 31 is meant to illustrate the connection between the VBPR 230 and the second source/drain contact 235B. The fourth trench 215, fifth trench 220, sixth trench 222, seventh trench 224, and an eighth trench (not shown) formed during middle-of-line (MOL) patterning are filled with a conductive metal (e.g., including a silicide liner, such as Ni. Ti, NiPt, an adhesion metal liner, such as TiN and conductive metal fill, such as W, Co, or Ru) to form the plurality of source/drain contacts 235A, 235B, 235C, 235D, the VBPR 230, and a source/drain contact-VBPR link, described in further detail below with respect to the description of FIG. 34. The first nanodevice ND1 includes the first source/drain contact 235A and the second source/drain contact 235B. The second nanodevice ND2 includes the third source/drain contact 235C and the fourth source/drain contact 235D. The VBPR 230 is located between the first dielectric liner and the second dielectric liner.

Figure 32:
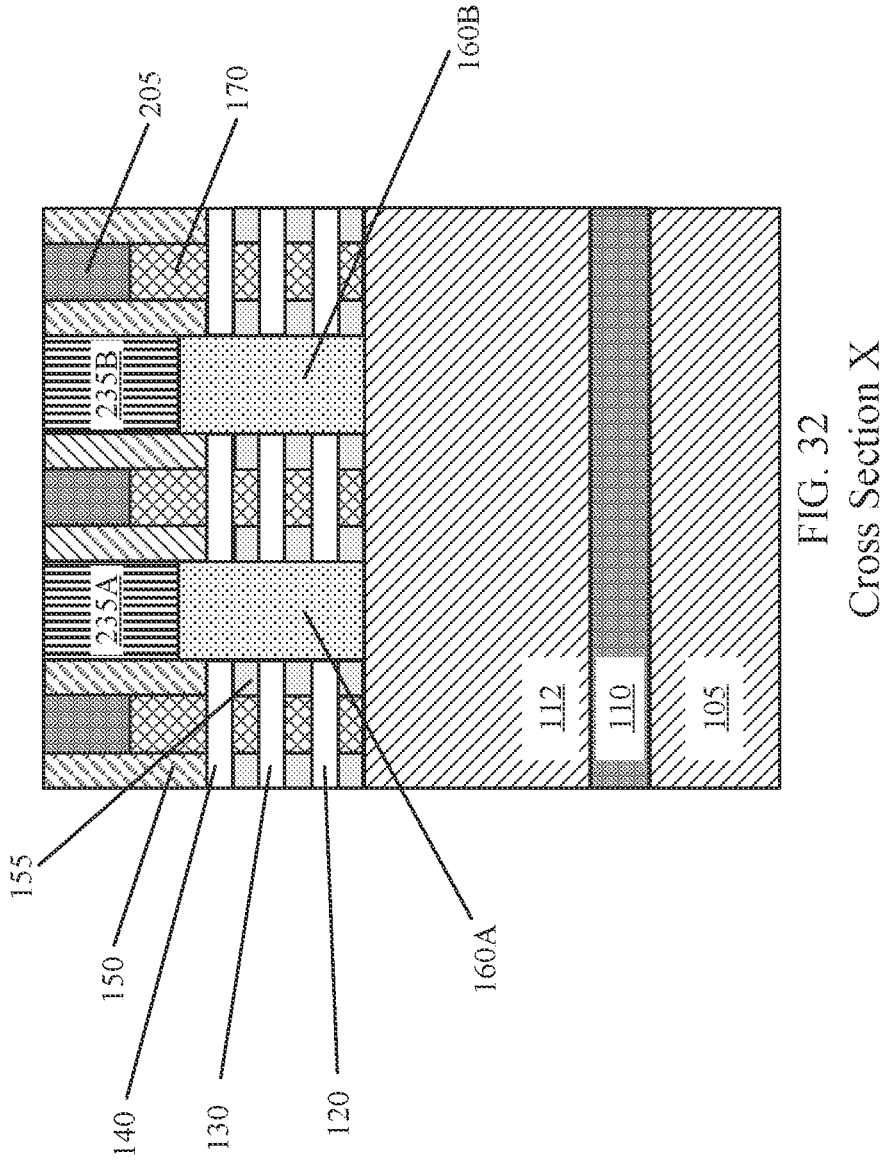
FIGS. 32-34 illustrate cross sections X, $Y_1$, and $Y_2$, respectively, of the plurality of nanodevices after the formation of the VBPR and the plurality of source/drain contacts, in accordance with the embodiment of the present invention.
Figures 33, 34:
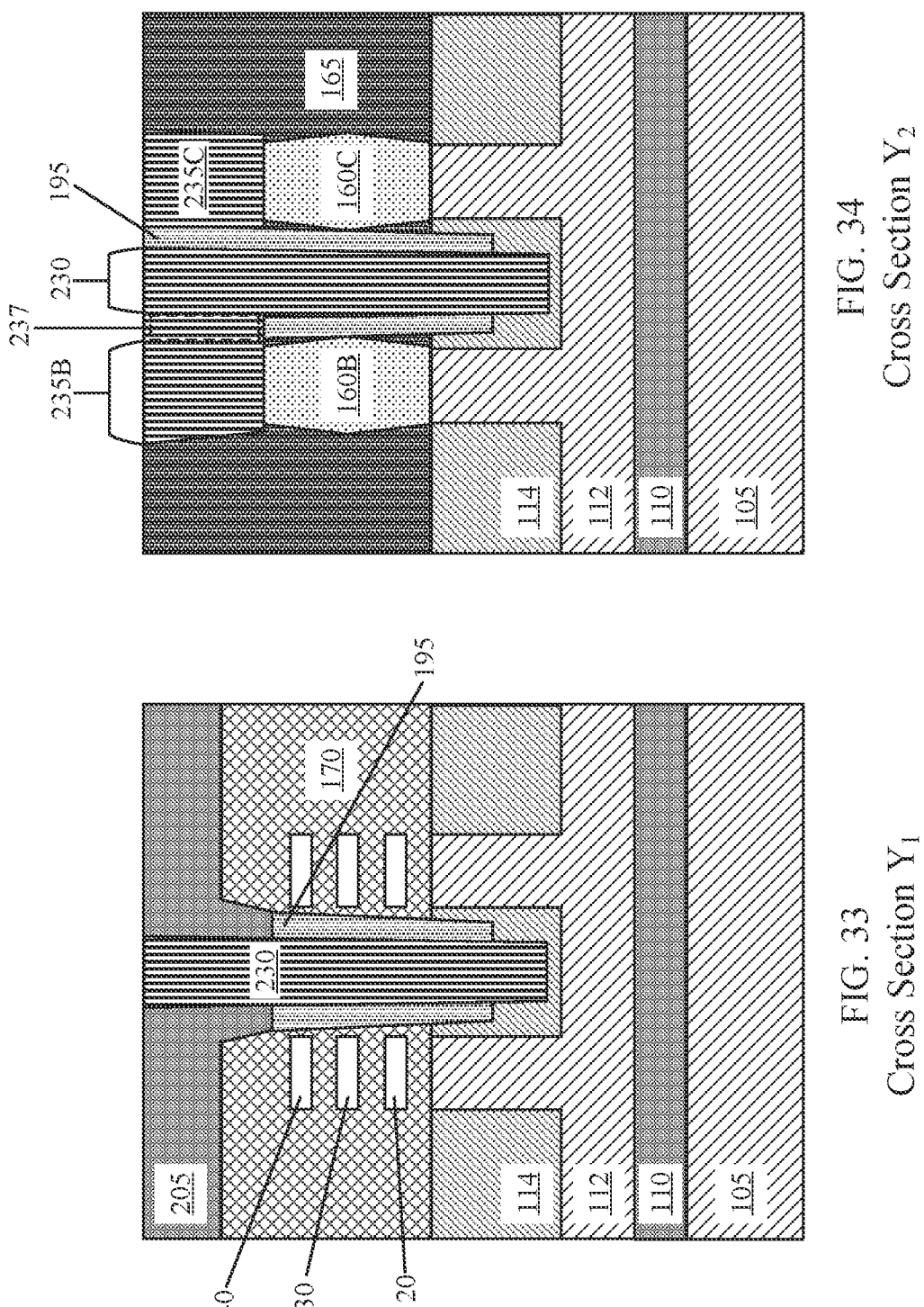

FIGS. 32-34 illustrate cross sections X, Y₁, and Y₂, respectively, of the plurality of nanodevices ND1, ND2 after the formation of the VBPR 230 and the plurality of source/drain contacts 235A, 235B, 235C, 235D, in accordance with the embodiment of the present invention. A bottom surface of the VBPR 230 is in contact with the STI region layer 114. In FIG. 32, the first source/drain contact 235A is located directly atop the first source/drain 160A. The second source/drain contact 235B is located directly atop the second source/drain 160B. In FIG. 33, a portion of the sidewalls of the VBPR 230 are in contact with the STI region 114, the dielectric liner 195, or the SAC cap 205, respectively.

In FIG. 34, the second source/drain contact 235B is located directly atop the second source/drain 160B. The third source/drain contact 235C is located directly atop the third source/drain 160C. A portion of the sidewalls of the VBPR 230 is in contact with the STI region 114, the dielectric liner 195, or the dielectric liner 195 and the second source/drain contact 235B, respectively. Dashed box 237 illustrates the source/drain contact-VBPR link. The source/drain contact-VBPR link is located between the VBPR 230 and the second source/drain contact 235B. The source/drain contact-VBPR link connects the second source/drain contact 235B to the VBPR 230. The first dielectric liner is defined by a recess. The source/drain contact-VBPR link extends downwards through the recess to connect to a frontside of the first dielectric liner. In FIG. 33, the head section of at least one SAC cap 205 extends downwards through the recess to connect to the frontside of the dielectric liner 195. In FIG. 31, the source/drain contact-VBPR link and a head section of the at least one SAC cap 205 are substantially in a same plane. The source/drain contact-VBPR link is in direct contact with the head section of at least one SAC cap 205. In FIG. 34, a height of the second dielectric liner is greater than a height of the first dielectric liner. The third source/drain contact 235C is separated from the VBPR 230 by the second dielectric liner.

Figure 35:
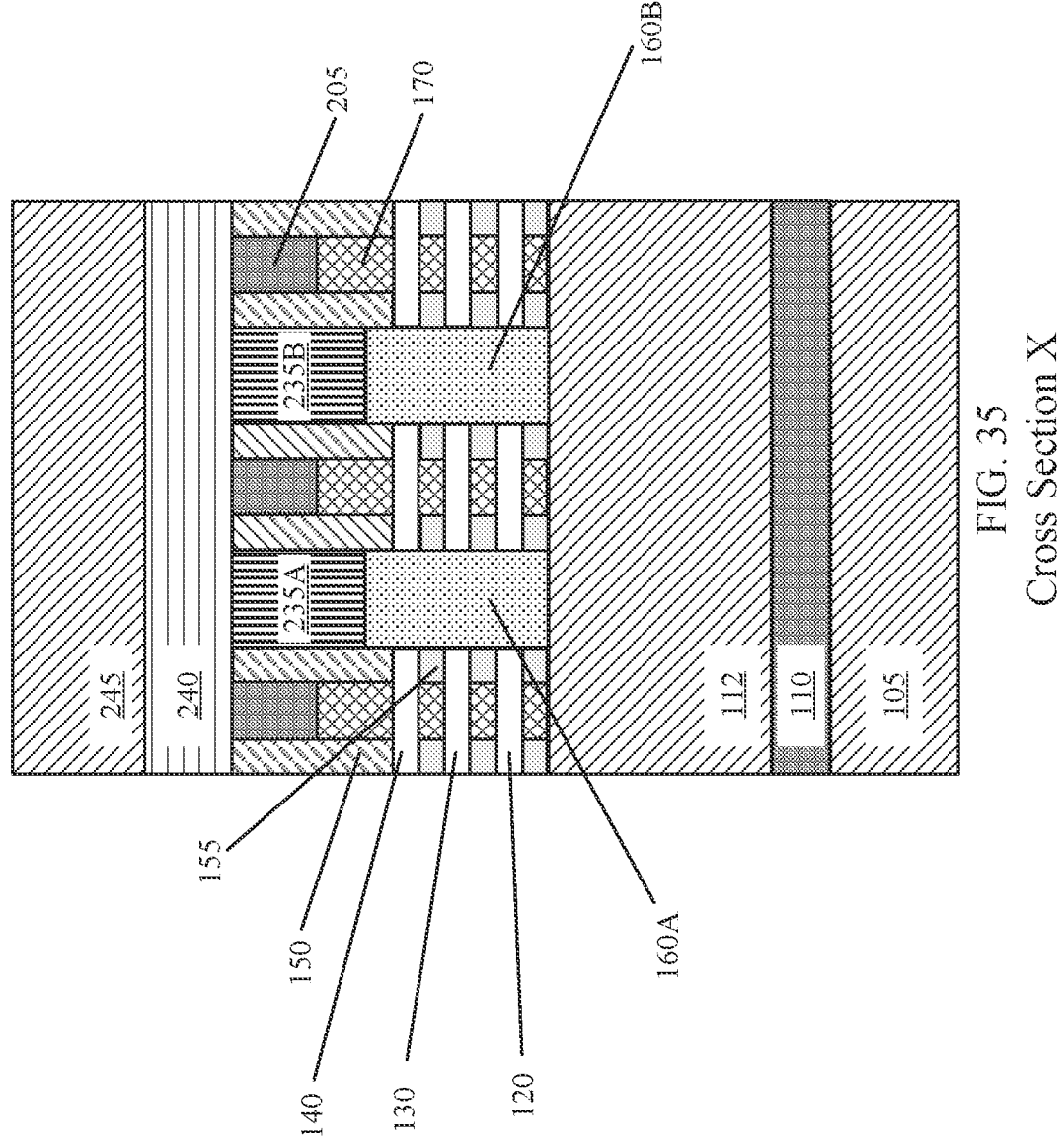
FIGS. 35-37 illustrate cross sections X, $Y_1$, and $Y_2$, respectively, of the plurality of nanodevices after the formation of a back-end-of-line (BEOL) layer and bonding to a carrier wafer, in accordance with the embodiment of the present invention.
Figures 36, 37:
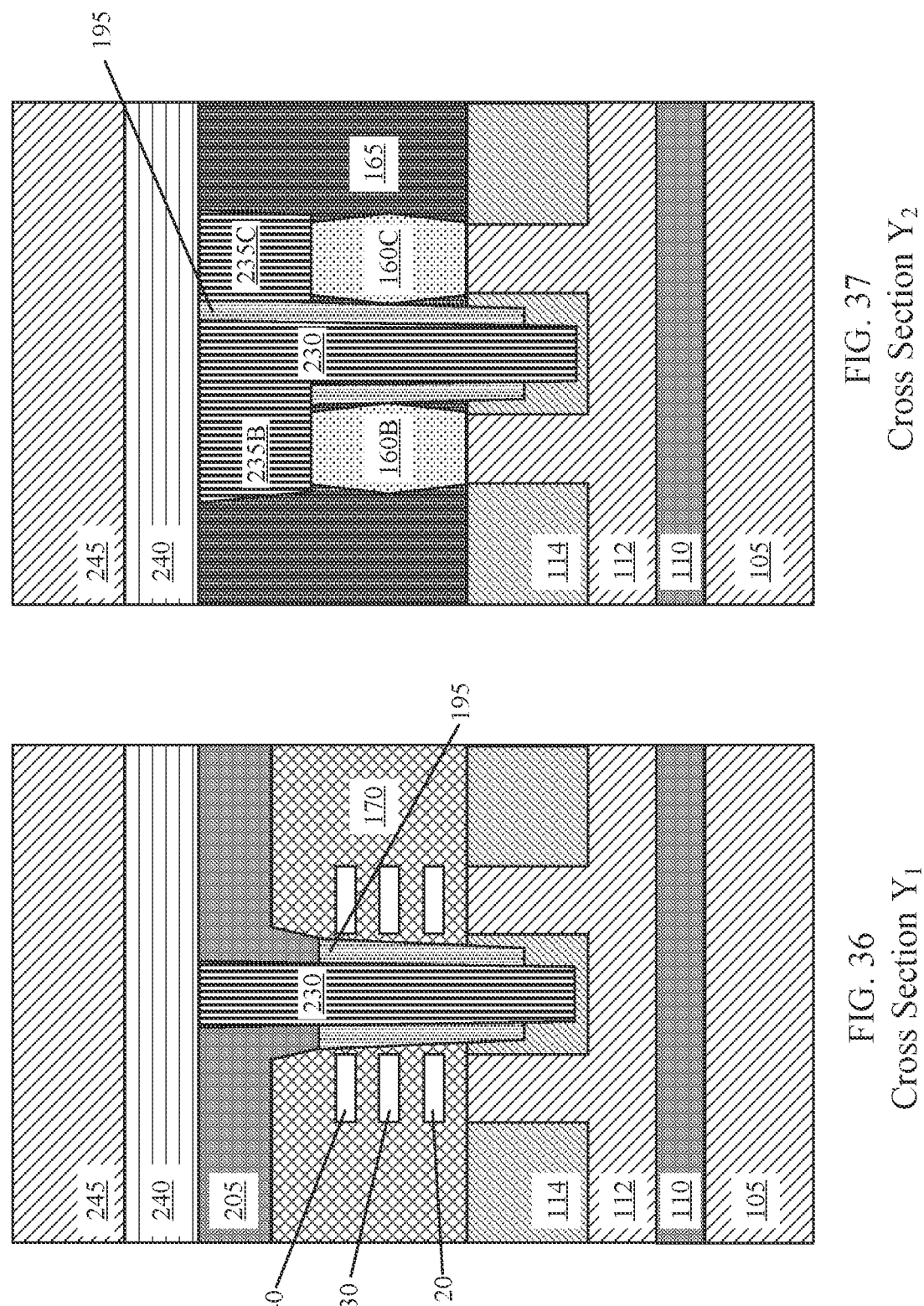

FIGS. 35-37 illustrate cross sections X, Y₁, and Y₂, respectively, of the plurality of nanodevices ND1, ND2 after the formation of a back-end-of-line (BEOL) layer 240 and bonding to a carrier wafer 245, in accordance with the embodiment of the present invention. The BEOL layer 240 may contain multiple metal layers and vias in between. In FIG. 35, the BEOL layer 240 is formed directly atop the gate spacers 150, the SAC caps 205, the first source/drain contact 235A, and the second source/drain contact 235B. In FIG. 36, the BEOL layer 240 is formed directly atop the SAC caps 205 and the VBPR 230. In FIG. 37, the BEOL layer 240 is formed directly atop the ILD 165, the second source/drain contact 235B, the source/drain contact-VBPR link, the second dielectric liner, and the third source/drain contact 235C. In FIGS. 35-37, the carrier wafer 245 is formed directly atop the BEOL layer 240 by bonding processes (e.g., oxide-oxide bonding).

Figure 38:
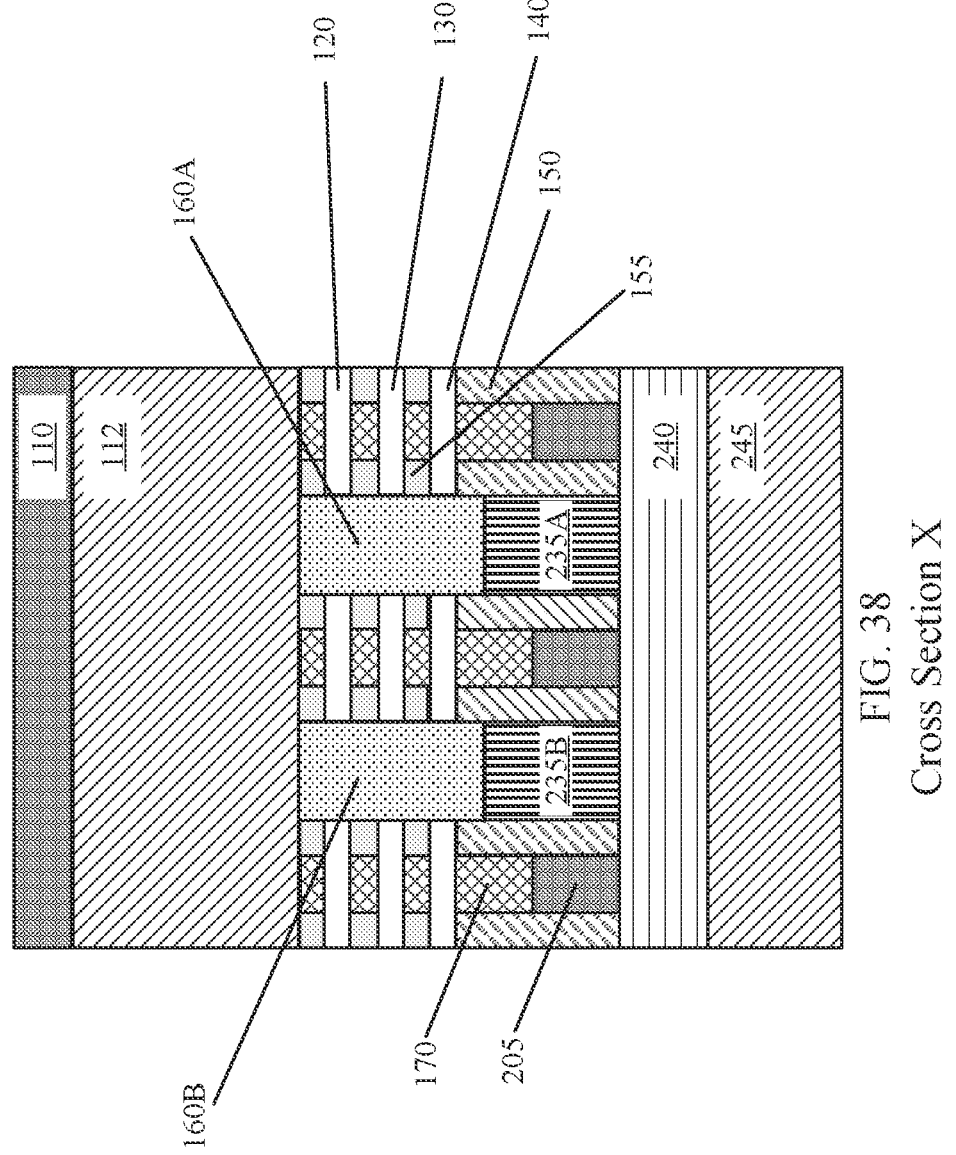
FIGS. 38-40 illustrate cross sections X, $Y_1$, and $Y_2$, respectively, of the plurality of nanodevices after the carrier wafer is flipped and the substrate is removed, in accordance with the embodiment of the present invention.
Figure 40:
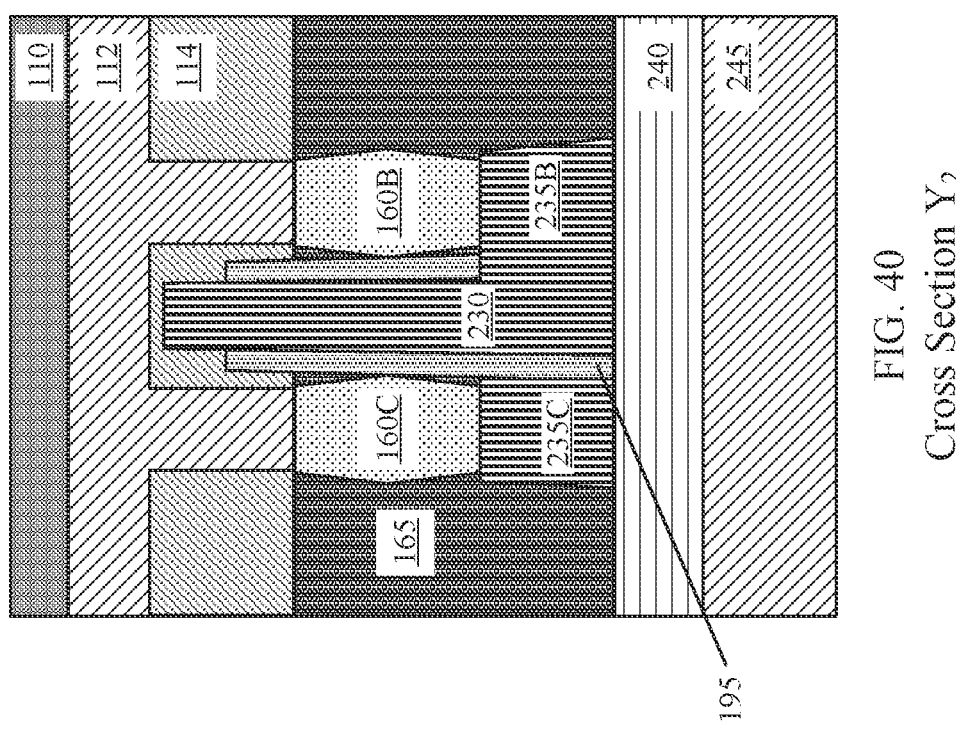
Figure 39:
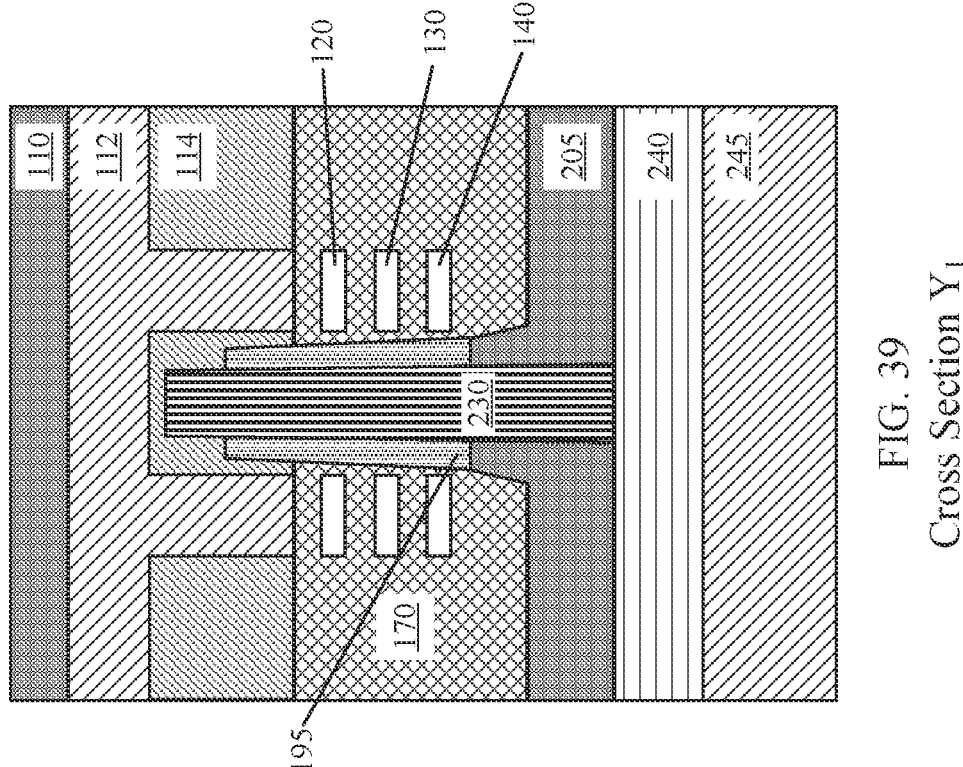

FIGS. 1-37 illustrate the processing of the frontside of the substrate 105, while FIGS. 38-46 illustrate the processing of the backside of the substrate 105. FIGS. 38-40 illustrate cross sections X, $Y_1$, and $Y_2$, respectively, of the plurality of nanodevices ND1, ND2 after the carrier wafer 245 is flipped and the substrate 105 is removed, in accordance with the embodiment of the present invention. The carrier wafer 245 is flipped and the carrier wafer 245 becomes a handler wafer. The substrate 105 is removed by, for example, a combination of processes such as wafer grinding, CMP, and/or selective dry/wet etch, stopping on the etch stop layer 110.

Figure 41:
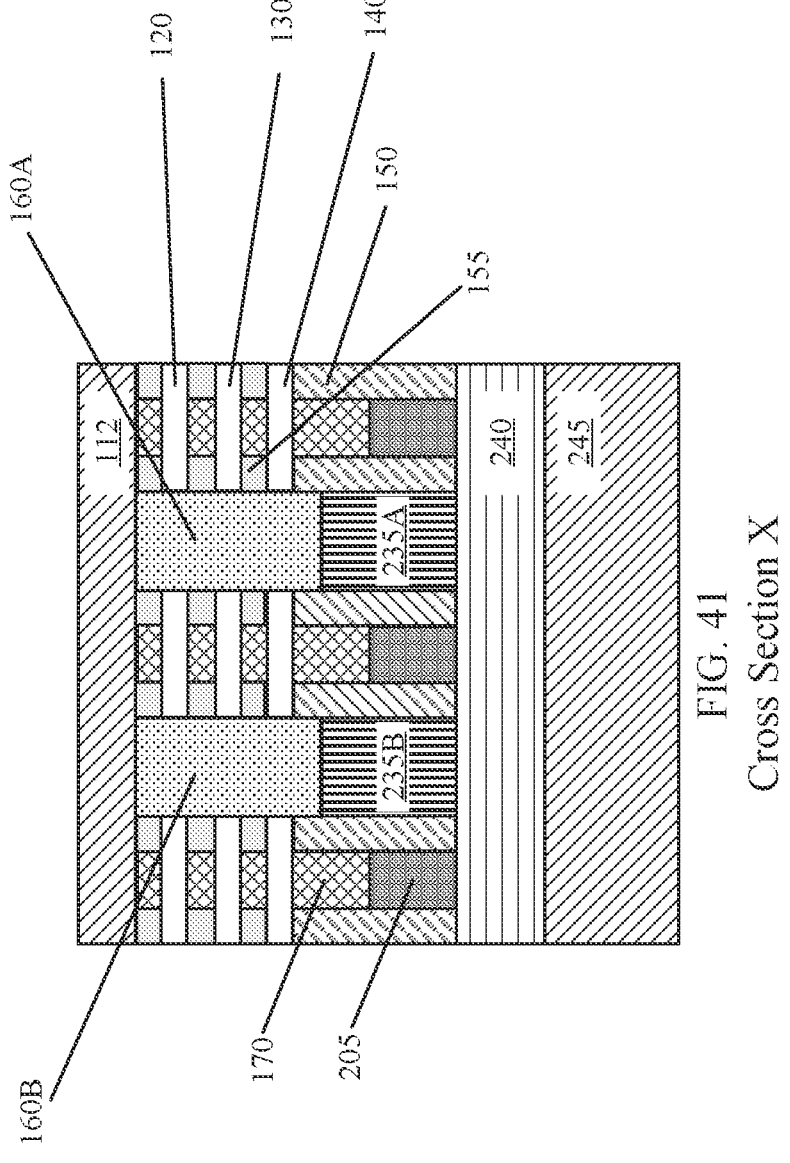
FIGS. 41-43 illustrate cross sections X, $Y_1$, and $Y_2$, respectively, of the plurality of nanodevices after the removal of the etch stop layer and the selective recessing of the underlying substrate layer, in accordance with the embodiment of the present invention.
Figures 42, 43:
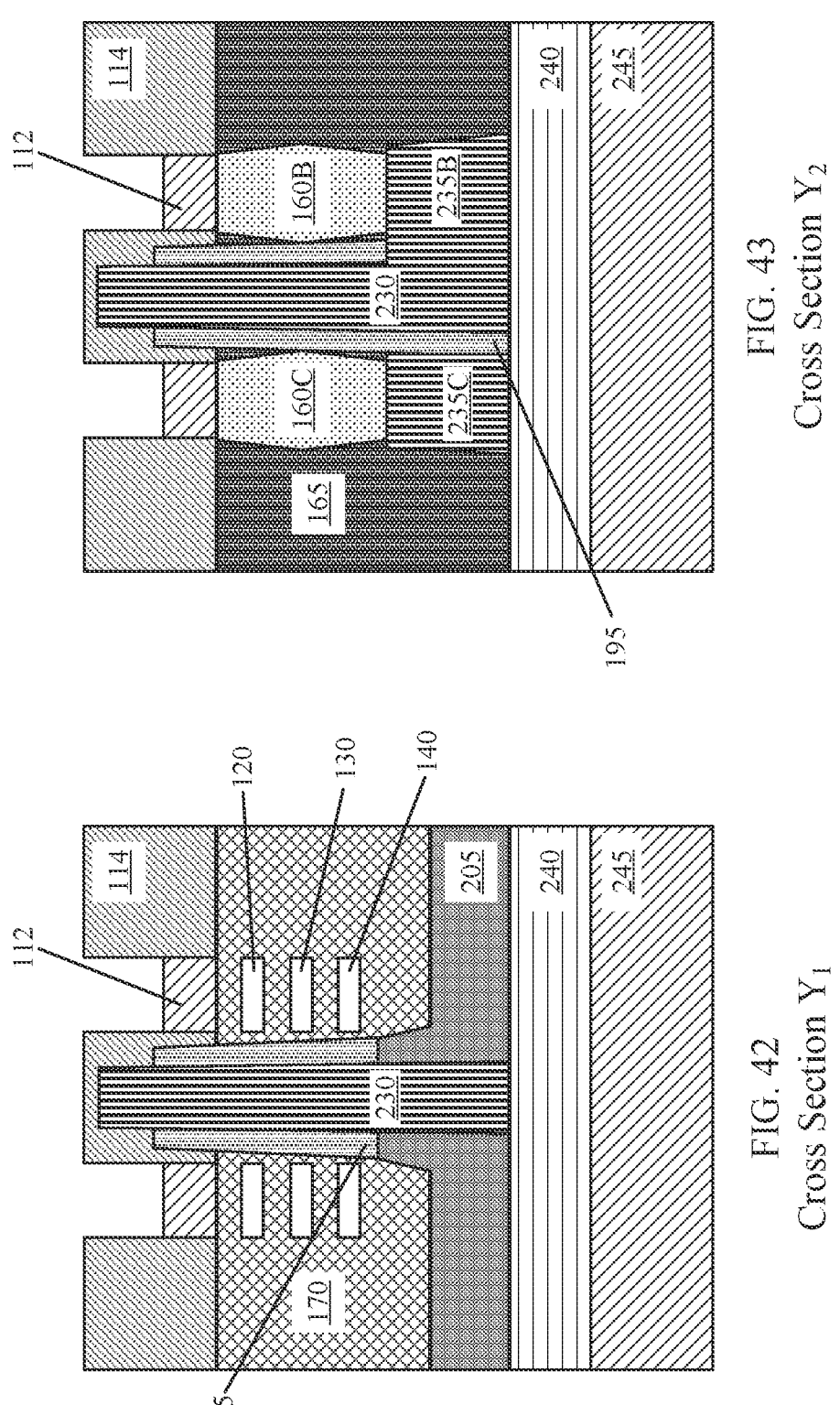

FIGS. 41-43 illustrate cross sections X, $Y_1$, and $Y_2$, respectively, of the plurality of nanodevices ND1, ND2 after the removal of the etch stop layer 110 and the selective recessing of the underlying substrate layer 112, in accordance with the embodiment of the present invention. The etch stop layer 110 is removed to expose the underlying substrate layer 112. A portion of the underlying substrate layer 112 is removed by, for example, a selective wet or dry etch process.

Figure 44:
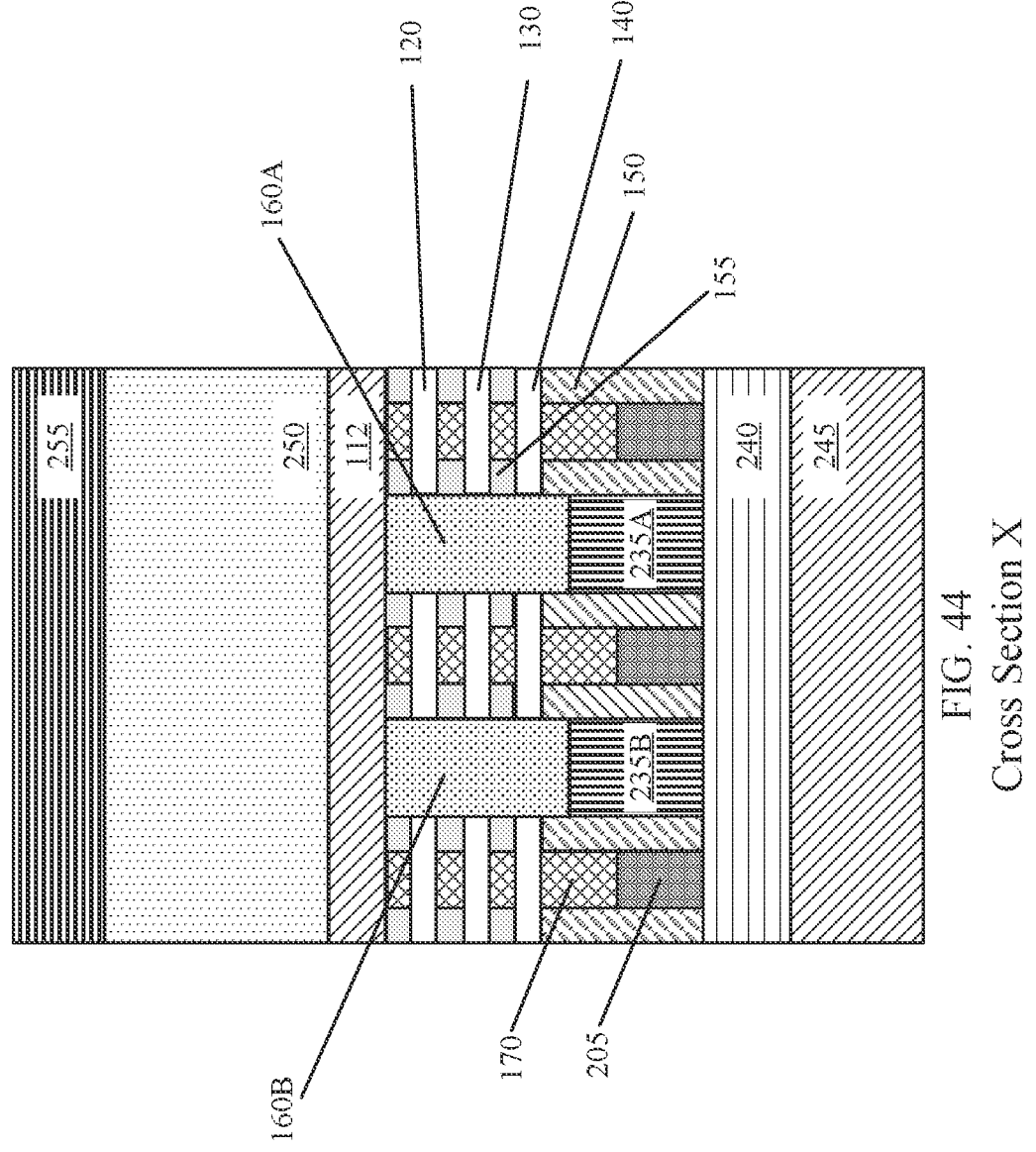
FIGS. 44-46 illustrate cross sections X, $Y_1$, and $Y_2$, respectively, of the plurality of nanodevices after the formation of a backside power distribution network (BSPDN) and a backside power rail (BPR), in accordance with the embodiment of the present invention.
Figures 45, 46:
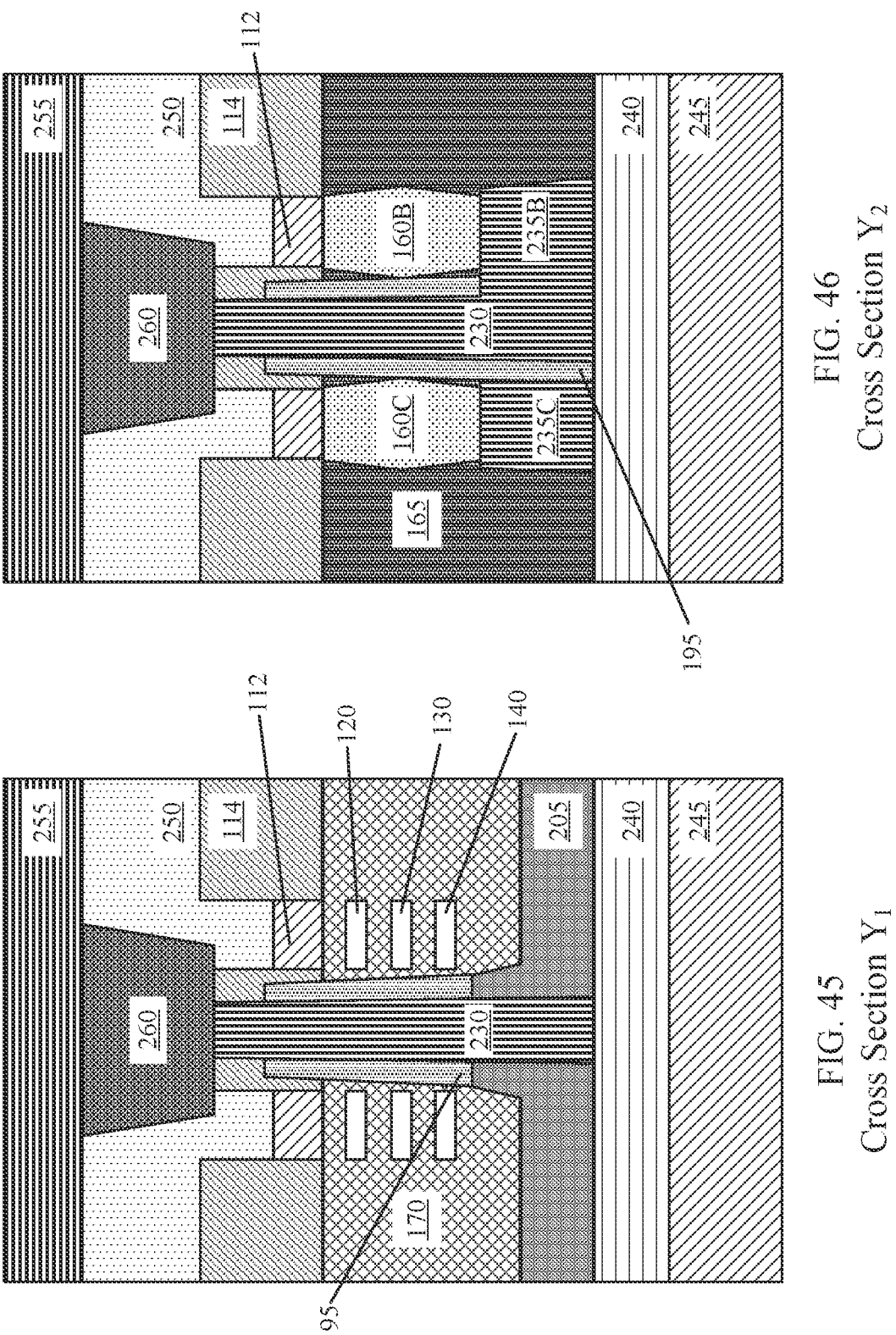

FIGS. 44-46 illustrate cross sections X, $Y_1$, and $Y_2$, respectively, of the plurality of nanodevices ND1, ND2 after the formation of a backside power distribution network (BSPDN) 255 and a backside power rail (BPR) 260, in accordance with the embodiment of the present invention. In FIG. 44, a backside ILD (BILD) layer 250 is deposited directly atop the underlying substrate layer 112. In FIGS. 45 and 46, the BILD layer 250 is deposited directly atop the underlying substrate layer 112 and the STI region 114. Then, the BPR 260 is patterned using conventional lithography and etching processes, followed by metallization (e.g., Cu, Co or Ru fill with adhesion liner such as TiN). The BPR 260 is formed directly atop the VBPR 230 and the STI region 114. A top surface of the VBPR 230 is connected to the BPR 260. The bottom surface of the BPR 260 is larger than the top surface of the VBPR 230. In FIG. 46, the third source/drain contact 235C is connected to a frontside of the third source/drain 160C. The second source/drain contact 235B is connected to a frontside of the second source/drain 160B. The VBPR 230 extends to a backside of the nanodevice ND1 to connect to the BPR 260. In FIG. 44, the BSPDN 255 is formed directly atop the BILD layer 250. In FIGS. 45 and 46, the BSPDN 255 is formed directly atop the BILD layer 250 and the BPR 260.

The plurality of SAC caps 205 are comprised of a head section and a shaft section. The head section of each SAC cap 205 extends the first width W1 parallel to the x-axis and is in direct contact with the frontside of the dielectric liner 195. The shaft section of each SAC cap 205 extends the second width W2 parallel to the x-axis, where the first width W1 is greater than the second width W2. By forming a recess in the dielectric liner 195, the head section of each SAC cap 205 extends downwards through the recess to connect to the frontside of the dielectric liner 195. The source/drain contact-VBPR link and the head section of at least one SAC cap are substantially in the same plane.

It may be appreciated that FIGS. 1-38 provide only an illustration of one implementation and do not imply any limitations with regard to how different embodiments may be implemented. Many modifications to the depicted environments may be made based on design and implementation requirements.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
a first nanodevice comprised of a plurality of first transistors;
a second nanodevice comprised of a plurality of second transistors, wherein the second nanodevice is located adjacent to and parallel to the first nanodevice along an x-axis;
a dielectric fill located between the first nanodevice and the second nanodevice;
a dielectric liner comprised of a first dielectric liner and a second dielectric liner, wherein the first dielectric liner is located between the first nanodevice and the dielectric fill, and wherein the second dielectric liner is located between the second nanodevice and the dielectric fill; and
a plurality of self-aligned contact (SAC) caps comprised of a head section and a shaft section, wherein the head section of each SAC cap extends a first width parallel to the x-axis and is in direct contact with a frontside of the dielectric liner, wherein the shaft section extends a second width parallel to the x-axis, wherein the first width is greater than the second width, and wherein the head section and the shaft section of the plurality of SAC caps have a T-shape.

2. The semiconductor device of claim 1, wherein each of the first dielectric liner and the second dielectric liner is defined by a recess.

3. The semiconductor device of claim 2, wherein the head section of each SAC cap extends downwards through the recess to connect to the frontside of the dielectric liner.

4. The semiconductor device of claim 1, wherein at least a portion of the head section of each SAC cap is in direct contact with the dielectric fill.

5. A semiconductor device comprising:
a first nanodevice comprised of a plurality of first transistors;
a second nanodevice comprised of a plurality of second transistors, wherein the second nanodevice is located adjacent to and parallel to the first nanodevice along an x-axis;
a dielectric fill located between the first nanodevice and the second nanodevice;
a dielectric liner comprised of a first dielectric liner and a second dielectric liner, wherein the first dielectric liner is located between the first nanodevice and the dielectric fill, and wherein the second dielectric liner is located between the second nanodevice and the dielectric fill;

a plurality of self-aligned contact (SAC) caps comprised of a head section and a shaft section, wherein the head section of each SAC cap extends a first width parallel to the x-axis and is in direct contact with a frontside of the dielectric liner, wherein the shaft section extends a second width parallel to the x-axis, and wherein the first width is greater than the second width; and a plurality of gate spacers in direct contact with the head section and the shaft section of each SAC cap.

6. The semiconductor device of claim 5, wherein each gate spacer is defined by a recess.

7. The semiconductor device of claim 6, wherein the head section of each SAC cap extends parallel to the x-axis through the recess to connect to the frontside of the dielectric liner.

8. The semiconductor device of claim 5, wherein the head section and the shaft section of the plurality of SAC caps have a T-shape.

9. The semiconductor device of claim 8, wherein each gate spacer is located in a seat of the T.

10. A semiconductor device comprising:

a first nanodevice comprised of a plurality of first transistors, wherein the first nanodevice includes a first source/drain contact and a second source/drain contact;

a second nanodevice comprised of a plurality of second transistors, wherein the second nanodevice includes a third source/drain contact and a fourth source/drain contact, and wherein the second nanodevice is located adjacent to and parallel to the first nanodevice along an x-axis;

a dielectric fill located between the first nanodevice and the second nanodevice;

a dielectric liner comprised of a first dielectric liner and a second dielectric liner, wherein the first dielectric liner is located between the first nanodevice and the dielectric fill, and wherein the second dielectric liner is located between the second nanodevice and the dielectric fill;

a plurality of self-aligned contact (SAC) caps comprised of a head section and a shaft section, wherein the head section of each SAC cap extends a first width parallel to the x-axis and is in direct contact with a frontside of the dielectric liner, wherein the shaft section extends a second width parallel to the x-axis, and wherein the first width is greater than the second width; and a plurality of gate spacers in direct contact with the head section and the shaft section of each SAC cap.

11. The semiconductor device of claim 10, further comprising:

a power via (VBPR) located between the first dielectric liner and the second dielectric liner.

12. The semiconductor device of claim 11, further comprising:

a source/drain contact-VBPR link located between the VBPR and the second source/drain contact.

13. The semiconductor device of claim 12, wherein the source/drain contact-VBPR link connects the second source/drain contact to the VBPR.

14. The semiconductor device of claim 13, wherein the first dielectric liner is defined by a recess.

15. The semiconductor device of claim 14, wherein the source/drain contact-VBPR link extends downwards through the recess to connect to a frontside of the first dielectric liner.

16. The semiconductor device of claim 15, wherein the source/drain contact-VBPR link and a head section of at least one SAC cap are substantially in a same plane.

17. The semiconductor device of claim 16, wherein the source/drain contact-VBPR link is in direct contact with the head section of the at least one SAC cap.

18. The semiconductor device of claim 17, wherein a height of the second dielectric liner is greater than a height of the first dielectric liner.

19. The semiconductor device of claim 18, wherein the head section of the at least one SAC cap extends downwards through the recess to connect to the frontside of the dielectric liner.

* * * * *